(12) United States Patent
Ushio et al.

(10) Patent No.: US 6,670,200 B2
(45) Date of Patent: *Dec. 30, 2003

(54) LAYER-THICKNESS DETECTION METHODS AND APPARATUS FOR WAFERS AND THE LIKE, AND POLISHING APPARATUS COMPRISING SAME

(75) Inventors: Yoshijiro Ushio, Kanagawa (JP); Takehiko Ueda, Tokyo (JP)

(73) Assignee: Nikon Corporation, Tokyo (JP)

( * ) Notice: Subject to any disclaimer, the term of this patent is extended or adjusted under 35 U.S.C. 154(b) by 13 days.

This patent is subject to a terminal disclaimer.

(21) Appl. No.: 09/881,224

(22) Filed: Jun. 13, 2001

(65) Prior Publication Data

US 2001/0039064 A1 Nov. 8, 2001

Related U.S. Application Data

(62) Division of application No. 09/316,082, filed on May 20, 1999.

(30) Foreign Application Priority Data

| May 21, 1998 | (JP) | 10-140292 |
| Jun. 1, 1998 | (JP) | 10-150963 |
| Sep. 3, 1998 | (JP) | 10-250071 |
| Oct. 12, 1998 | (JP) | 10-289175 |
| Feb. 25, 1999 | (JP) | 11-047485 |

(51) Int. Cl.$^7$ .................. H01L 21/00; G01L 31/26; G01N 23/223
(52) U.S. Cl. .................. 438/14; 451/6; 451/8; 451/41; 451/59; 438/16; 378/44; 378/45; 378/46; 378/50
(58) Field of Search .............. 438/14, 16; 451/6, 451/8, 41, 59; 378/44, 45, 46, 50, 70, 74, 86, 88, 89

(56) References Cited

U.S. PATENT DOCUMENTS 4,645,349 A   2/1987  Tabata
4,744,660 A   5/1988  Noguchi et al.

(List continued on next page.)

FOREIGN PATENT DOCUMENTS

| EP | 0 824 995 A1 | 2/1998 |
| EP | 0 738 561 B1 | 1/2000 |

(List continued on next page.)

OTHER PUBLICATIONS

Ushio et al., "In–situ monitoring of CMP process utilizing 0–order spectrometry," CMP–MIC Conference, Feb. 11–12, 1999, 1999 IMIC–400P199/0023, pp. 23–29.

(List continued on next page.)

*Primary Examiner*—David Nelms
*Assistant Examiner*—Reneé R. Berry
(74) *Attorney, Agent, or Firm*—Klarquist Sparkman, LLP

(57) ABSTRACT

Methods and apparatus are disclosed for detecting a thickness of a surficial layer (e.g., metal or insulating layer) on a workpiece (e.g., semiconductor wafer) during a process for planarizing the layer, so as to stop the process when a suitable process endpoint is reached. Layer thickness is detected based on a spectral-characteristic signal of reflected or transmitted signal light, obtained by directing a probe light onto the surface of the workpiece. Example spectral characteristics are local maxima and minima of signal-light waveform, differences or quotients of the same, a dispersion of the signal-light waveform, a component of a Fourier transform of the signal waveform, a cross-correlation function of the signal waveform. Alternatively, the zeroth order of signal light is selected for measurement, or a spatial coherence length of the probe light is compared with the degree of fineness of the pattern on the surface illuminated with the probe light. An optical model can be determined based on the comparison, and at least one of the layer thickness and the process endpoint is detected by comparing the measured signal-light intensity with the calculated theoretical signal-light intensity.

9 Claims, 10 Drawing Sheets

U.S. PATENT DOCUMENTS

| | | | |
|---|---|---|---|
| 5,696,583 | A | 12/1997 | Yoon |
| 5,893,796 | A | 4/1999 | Birang et al. |
| 5,964,643 | A | 10/1999 | Birang et al. |
| 6,045,439 | A | 4/2000 | Birang et al. |
| 6,102,775 | A * | 8/2000 | Ushio et al. ............ 451/6 |
| 6,280,290 | B1 | 8/2001 | Birang et al. |
| 6,466,642 | B1 * | 10/2002 | Meloni ............ 378/44 |
| 6,537,133 | B1 | 3/2003 | Birang et al. |
| 2001/0036805 | A1 | 11/2001 | Birang et al. |

FOREIGN PATENT DOCUMENTS

| | | |
|---|---|---|
| JP | 56-153207 | 11/1981 |
| JP | 60-305 | 1/1985 |
| JP | 61-76904 | 4/1986 |
| JP | 61-235708 | 10/1986 |
| JP | 64-057107 | 3/1989 |
| JP | 6-147838 | 5/1994 |
| JP | 06-252113 | 9/1994 |
| JP | 8-145631 | 6/1996 |
| JP | 9-7985 | 1/1997 |
| JP | 63-050703 | 3/1998 |
| JP | 10311708 | 11/1998 |

OTHER PUBLICATIONS

Ushio et al., "In–situ monitoring of CMP process utilizing O–order spectrometry," Journal on C.M.P., *Instit. for Microelectronics Interconnection,* vol. 1, No. 1, Fall 1999.

* cited by examiner

LAYER-THICKNESS DETECTION METHODS AND APPARATUS FOR WAFERS AND THE LIKE, AND POLISHING APPARATUS COMPRISING SAME

CROSS-REFERENCE TO RELATED APPLICATION

This application is a divisional of co-pending U.S. patent application Ser. No. 09/316,082, filed on May 20, 1999.

FIELD OF THE INVENTION

The present invention relates to any of various methods for planarizing a surface of a workpiece such as a semiconductor wafer during manufacturing semiconductor devices on the wafer. A representative such method is "chemical mechanical polishing" ("CMP") as used to planarize semiconductor wafers between certain manufacturing steps. More specifically, the invention pertains to methods and apparatus for detecting a "process endpoint" (i.e., time to stop planarizing).

BACKGROUND OF THE INVENTION

Semiconductor devices (e.g., integrated circuits, displays, and the like) are becoming increasingly dense and highly integrated. With this trend, certain processes such as processes directed to formation of multiple wiring layers, formation of insulating films between wiring layers, formation of inter-layer connecting plugs and the like, and formation of electrodes are becoming increasingly more critical. For example, controlling the thickness and depth profiles of inter-layer insulating films or metal layers is now very important to ensure attainment of target integration levels in devices with high reliability. Achieving such control requires that layer thicknesses in steps such as layer-formation steps and etching steps be monitored.

Responsive to the need to achieve ever-increasing device density along with ever-decreasing feature sizes, the microlithography industry has developed microlithography apparatus that utilize extremely short wavelengths of light, such as deep-UV light, but at large numerical apertures. Projection optics used in such apparatus have extremely short focal ranges. The focal ranges are now so short that the uneven surface that results from stacking multiple layers atop one another during manufacture of an integrated circuit is no longer in sharp focus from peaks to valleys of the surface. Consequently, it has become increasingly important to planarize the surface of the wafer (at least within exposure areas) accurately between certain layer-formation steps. It is also important to perform a planarization step after embedding an inlay of a metal electrode layer to form inter-layer connecting plugs and the like.

Planarization typically involves the removal of material from the surface of the wafer. Whereas several candidate techniques have now been developed for performing planarization, as summarized below, a key problem has been how to accurately detect, during planarization, when to stop planarizing so as to ensure the desired amount of material has been removed without removing excessive material.

Among the several conventional planarization methods, a polishing process termed "chemical mechanical polishing" or "chemical mechanical planarization" (abbreviated "CMP") has received considerable favor. This is because, inter alia, CMP is effective for planarizing wafers having a large surface area and is effective for planarizing microscopic bumps and other surficial irregularities from wafer surfaces. CMP achieves such results from a combination of mechanical abrasion (using an abrasive in liquid suspension) and chemical action (using a mild surface-eroding chemical in the liquid suspension). More specifically, during CMP, the wafer surface is urged against a polishing pad, saturated with a polishing slurry, as the wafer and polishing pad undergo motion relative to each other. The polishing slurry is a suspension of polishing granules (silica, alumina, cerium oxide, or the like, depending on the material on the surface of the wafer) in an acidic or basic (depending on the material on the wafer surface) carrier liquid. With CMP, the entire surface of the wafer can be polished uniformly by making sure that the applied polishing pressure, amount of slurry used, and velocity of relative motions are uniform over the entire wafer surface.

Unfortunately, achieving consistent results with CMP is much more difficult than with other semiconductor processing steps such as layer-forming and etching. Therefore, there is a great need for improved methods for monitoring the thickness of the layer(s) on a wafer being polished by CMP, especially such methods that can provide quick, accurate, and efficient feedback to the CMP apparatus.

According to one conventional approach for monitoring polishing, changes in friction between the wafer and the polishing pad are monitored as corresponding changes in the torque being applied by a motor used to effect rotation of the wafer or polishing pad. For example, a change in torque is encountered when polishing has progressed to an underlying layer made of a material having a substantially different coefficient of friction than the layer being polished away. Unfortunately, monitoring polishing by monitoring torque is notoriously inaccurate and unreliable.

Optical methods for monitoring polishing offer prospects for high accuracy. According to one conventional method, a small wafer "blank" region (i.e., a location on a wafer where the surficial layer is essentially planar and desirably not patterned) is subjected to the same CMP process as the remainder of the wafer and used as a measurement sample. Measuring the thickness of the surficial layer as polishing progresses is performed by monitoring changes in the blank region.

Unfortunately, the "blank"-measurement method has several serious disadvantages. First, the method requires considerable time to execute and to provide feedback to the actual polishing process. Wafers are normally imprinted with as many devices as possible placed side by side. A non-imprinted portion, for use as a blank, of the wafer must be located among the devices on the wafer. The area of such a blank is normally very small and, on some wafers, has an unspecified location. Because the size of the blank region is normally very small, the range of measurements that can be performed at the location is also very small. Available apparatus for accurately measuring layer thickness within such a small area are simply not available. It is also very difficult to perform measurements in such a small area at sufficiently high speed because the required mechanism for picking up, recognizing, and processing the image of the blank region is very complex.

Also, positioning the wafer for measurement at the blank location poses many problems. Because the blank location is normally very small (and sometimes not even specified), accurate alignment mechanisms are required to ensure that the measurements are consistently performed at the blank location.

Another substantial contributor to the excessive amount of time required to perform the "blank" technique is the need to interrupt polishing, clean the wafer, and transport the wafer to a remote but stable location for measurement.

In another conventional optical method for monitoring polishing, the thickness of the layer being polished is monitored by optical interference. In such a technique, an optical path is provided through the polishing pad to the wafer surface being polished, and a laser light beam is directed through the polishing pad to the wafer surface during polishing. Alternatively, light (e.g., infrared light) is transmitted through the wafer holder and through the wafer from the rear surface of the wafer to the surface being polished. Temporal changes in the intensity of light reflected from the surface being polished are monitored as polishing progresses, and a polishing endpoint is believed to be reached when the intensity of the reflected laser light ceases to change with further polishing. Use of such a method for measuring the thickness of a layer at a "blank" location is normally effective in achieving a satisfactory accuracy. However, requisite accuracy is not obtained whenever the method is used to detect a polishing endpoint for a patterned layer (which must be performed when attempting to monitor polishing in real time as polishing progresses). This problem is even more pronounced when the wafer surface is patterned with logic circuits or a combination of logic and memory circuits.

Moreover, because the wafer undergoes motion during polishing, signals from a specific (blank) location on the wafer are not normally obtainable, either directly or extracted from signals from other portions of the wafer surface. This method is also susceptible to obfuscating effects of signal noise, making determinations of polishing endpoint even more difficult to obtain. Consequently, polishing endpoint detection by this technique as conventionally applied cannot be reliably realized, especially in real time.

According to yet another conventional optical approach, the layer thickness is monitored by illuminating onto the wafer surface a light beam having a relatively large spot diameter. Optical measurements of light reflecting from the wafer surface are made and averaged. Unfortunately, if the wafer is imprinted with device patterns, the waveform of reflected light is usually extremely complex since the signal depends not only upon the layer thickness but also on the device patterns. Therefore, the thickness of a layer being polished cannot be measured reliably or accurately using this method.

Other methods that have received some attention include detecting changes in vibration or sounds, or detecting changes in slurry composition that purportedly occur whenever a polishing endpoint is being approached. None of these techniques has proved to be effective or reliable.

As can be ascertained from the foregoing summary, none of the conventional techniques for monitoring the thickness of a layer during polishing is satisfactory for current requirements. Each technique as conventionally applied suffers from one or more deficiencies such as, inter alia, excessive time required for performing the measurements and providing feedback to the polishing process, inaccuracy of determinations of layer thickness, lack of repeatability, and/or inapplicability to certain types of layers or to certain steps during manufacture of a semiconductor device.

SUMMARY OF THE INVENTION

In view of the above-summarize shortcomings of the prior art, an object of the invention is to provide, inter alia, simple and convenient detection methods by which the thickness of one or more layers on the surface of a workpiece (e.g., wafer) can be determined. Such determinations are especially useful in the determination of a process endpoint.

According to a first aspect of the invention, methods are provided for determining a thickness of a superficial thin-film layer on a substrate as the thin-film is being subjected to a process resulting in a change in thickness of the thin-film layer. According to a representative embodiment of such a method, a probe light is illuminated onto a region of a surface of the thin-film layer to produce a signal light propagating from the thin-film layer. The signal light is detected. From the detected signal light, a spectral characteristic of the signal light is measured to produce a spectral-characteristic signal. A value of a parameter of the spectral-characteristic signal is calculated, wherein the value is a function of the thickness of the thin-film layer. From the calculated value of the parameter, the thickness of the thin-film layer is determined. Such a process can also include the step of determining, from the calculated value of the parameter, an endpoint at which to terminate the process and thus cease changing the thickness of the thin-film layer. An exemplary and especially useful spectral characteristic is spectral reflectance. ($R(\lambda)$).

Although such a method can be applied to any of various workpieces bearing one or more surficial thin layers, the method is especially applicable to semiconductor wafers having one or more surficial thin-film layers including, for example, one or more electrode layers, metal layers, and insulator layers.

Any of various parameters of the spectral characteristic can be used for determining the thickness of a layer. For example, the parameter can be a local maximum of the spectral-characteristic signal (wherein a "local maximum" is a peak appearing in a plot of the spectral characteristic), a local minimum of the spectral-characteristic signal (wherein a "local minimum" is a valley appearing in a plot of the spectral characteristic), a difference of a selected local minimum from a selected local maximum, or a quotient of a selected local minimum to a selected local maximum. Other possible parameters include a largest local maximum of the spectral-characteristic signal, a smallest local minimum of the spectral-characteristic signal, a difference of the largest local minimum from the largest local maximum, and a quotient of the smallest local minimum to the largest local maximum. Yet other parameters include a spectral dispersion of the spectral-characteristic signal (wherein a "spectral dispersion" is a variance of the spectral characteristic) and a component of a Fourier transform of the spectral-characteristic signal.

The signal light that is detected can be probe light reflected from the surface of the workpiece or transmitted through the workpiece.

As summarized above, various conventional methods for optically measuring the thickness of a thin film are known. In conventional methods employing interference phenomena, the requisite high accuracy is achieved only when the methods are used to measure the thickness of a blank film (i.e., a uniformly flat film). Methods according to the present invention (such as the method summarized above), in contrast, can be utilized for measuring not only the thickness of a blank film but also the thickness of, e.g., a layer on a wafer having a device pattern (substrate pattern) that is two-dimensionally non-uniform. In such an application instance, the obtained signals differ substantially from the signals obtainable from a blank film.

In methods according to the invention, such as those summarized above, signal light that is reflected from or transmitted through the workpiece are processed to obtain a measure of a parameter that desirably rapidly changes when the process is at or near a process endpoint.

According to another aspect of the invention, in a process for progressively reducing a thickness of a thin-film layer on a surface of a substrate, methods are provided for detecting a process endpoint representing a minimum desired thickness of the thin-film layer. According to a representative embodiment of such a method, a probe light is directed onto a region of a surface of the thin-film layer to produce a signal light propagating from the thin-film layer. The signal light is detected and a spectral characteristic of the signal light is measured from the detected signal light so as to produce a spectral-characteristic signal. A cross-correlation function is calculated. The cross-correlation function is of the spectral-characteristic signal with a predetermined reference spectral-characteristic signal. The cross-correlation function exhibits a change with a corresponding change in the thickness of the thin-film layer. From the cross-correlation function, the process endpoint is determined.

According to yet another aspect of the invention, apparatus are provided for determining a process endpoint of a process for reducing a thickness of a thin-film layer on a substrate. A representative embodiment of such an apparatus comprises a source of a probe light, a probe-light optical system, a detector, a signal-light optical system, and a signal processor. The probe-light optical system directs the probe light to a location on a surface of the thin-film layer so as to produce a signal light propagating from the location. The detector detects the signal light, and the signal-light optical system directs the signal light from the location to the detector. The signal processor, which is connected to the detector, measures a spectral characteristic of the signal light from the detected signal light, calculates a parameter of the spectral characteristic that is a function of the thickness of the thin-film layer, and determines the thickness of the thin-film layer from the calculated parameter.

According to yet another aspect of the invention, apparatus are provided for planarizing a surface of a workpiece. A representative embodiment of such an apparatus comprises a polishing pad and a polishing head. The polishing head is configured to support the workpiece and contact the workpiece against the polishing pad. A mechanism is provided to move the polishing pad and the polishing head relative to each other as the workpiece contacts the polishing pad for polishing the workpiece. This apparatus also includes a device for determining a process endpoint as summarized in the preceding paragraph, for example.

According to yet another aspect of the invention, processes are provided for detecting, for example while reducing a thickness of a thin-film layer on a surface of a workpiece, the thickness of the thin-film layer. According to a representative embodiment of such a process, a probe light is directed to a location on the thin-film layer so as to produce a signal light propagating from the location. A signal waveform is produced from the signal light, and a value of a parameter of the signal waveform is calculated. From such a value, a thickness of the thin-film layer is detected. The parameter can be, for example, a difference between a largest local maximum of the signal waveform and a smallest local minimum of the signal waveform. Other exemplary parameters are the smallest local minimum of the signal waveform, a quotient of the smallest local minimum of the signal waveform to the largest local maximum of the signal waveform, and the mean of the signal waveform. An example mean is of spectral reflectance: $\Sigma(R(\lambda))/n$, wherein n is the sample size.

The method summarized in the preceding paragraph solves the problem of optically measuring a process endpoint with a satisfactory degree of accuracy in the case in which a device pattern exists on the wafer surface. It has been discovered that signal light obtained by illuminating a probe light onto the wafer surface is a superposition of a pattern interference component and a film-thickness interference component. It has also been discovered that the magnitude of the pattern-interference component changes according to changes in the device pattern on the wafer. In other words, since the magnitude of the pattern-interference component changes in accordance with changes in the device pattern on the wafer, the signal light contains a degree of uncertainty that corresponds to the device pattern (i.e., the type of device corresponding to the pattern). For example, there is a significant difference in the degree of uncertainty between a DRAM that is a part of a memory, part of a logic device, and part of a device having both a logic component and a memory component. This uncertainty arises because the pattern-interference components of these devices differ significantly from each other due to differences in the degree of integration, even if the devices are of the same type.

Another type of uncertainty by which the magnitude of the pattern-interference component differs is the location on the pattern at which measurement is performed, even among devices of the same type and having the same degree of integration. In a memory device such as a DRAM, the degree of uncertainty of this type is small since the pattern on the memory device can be regarded as a uniform continuation of its periodic structure. However, the pattern on a logic device or a device having a logic component and a memory component is not uniform. Hence, in such a device, the degree of this type of uncertainty is high. It has been discovered that such types of uncertainties are major causes of large errors encountered in the detection of process endpoints and the like in the prior art. According to the method summarized above, the causes of such uncertainty are alleviated by specifying a position for measurements of the device pattern based on a suitable parameter obtained from the signal-light waveform.

The method summarized above can further comprise the step of providing a reference value of the parameter corresponding to a reference thickness of the thin-film layer. The actual measured thickness of thin-film layer can be compared with the reference value to obtain a comparison value. From the comparison value, a process endpoint can be calculated, wherein the process endpoint represents a point at which to cease reducing the thickness of the thin-film layer. The method can also further comprise the step of specifying on the thin-film layer a measurement position that includes the location. In such a method, the measurement of the value of the parameter is performed at the measurement position. A reference value of the parameter, corresponding to a reference thickness of the thin-film layer at the measurement position, can be provided. In such an instance, the actual measured thickness of the thin-film layer can be compared with the reference value to obtain a comparison value. From the comparison value, a process endpoint can be calculated at which to cease reducing the thickness of the thin-film layer.

According to a further modification of the method, an optical signal (e.g., a reflectance signal) is obtained from a desired measurement position on the surface of the workpiece. From the optical signal, a thickness of the thin-film layer is calculated. For example, thickness can be algebraically calculated from one or more local maxima in a plot of the optical signal, or by fitting a measured waveform to a pre-calculated waveform.

The calculated thickness is compared with a reference thickness at the measurement position so as to determine a process endpoint at which to cease reducing the thickness of the thin-film layer.

According to yet another aspect of the invention, methods are provided, for use in processes for reducing the thickness of a thin-film layer on an integrated circuit device formed on a surface of a semiconductor wafer, for detecting the thickness of the thin-film layer. According to a representative embodiment of such a method, a probe light is directed to a location on the thin-film layer so as to produce a signal light propagating from the location. The signal light is produced either by reflection of probe light from the thin-film layer or transmission of probe light through the thin-film layer. All orders of diffracted light are removed from the signal light except a zeroth order of diffracted light from which a signal waveform is produced. A value of a parameter of the signal waveform is calculated, from which value a thickness of the thin-film layer is calculated. The higher orders (i.e., greater than zeroth order) of diffracted light are removed by passing the signal light from the location through an aperture (which can be variable-sized) defined by an aperture plate, wherein the aperture plate blocks the higher orders of diffracted light. Alternatively, a two-dimensionally distributed measurement of a spot pattern of the signal light can be provided while blocking the higher orders of signal light. (A two-dimensional spot pattern can be obtained by, e.g., detecting signal light using a sensor comprising two-dimensionally distributed sensor elements, such as a CCD panel.)

With respect to the method summarized above, a conventional cause of difficulty encountered while attempting to detect the thickness of a film on the device pattern on a wafer with satisfactory accuracy is addressed. It has been discovered that reflected signal light obtained by illuminating a probe light onto the device pattern exhibits many diffraction spots caused by a diffraction of light reflecting from a device pattern having regular fine features (wherein diffraction spots are generated from a two-dimensionally distributed pattern, in comparison to diffraction fringes generated from a one-dimensionally distributed pattern). Each of the diffraction spots changes, in a different manner depending on the film thickness, for each order of diffraction. Thus, the obfuscating influence of higher diffraction orders is eliminated.

According to yet another aspect of the invention, apparatus are provided for determining a process endpoint of a process for reducing a thickness of a thin-film layer on a substrate. A representative embodiment of such an apparatus comprises a source of probe light, a probe-light optical system, a detector, a signal-light optical system, an aperture-defining plate, and a signal processor. The probe-light optical system directs the probe light to a location on a surface of the thin-film layer so as to produce a signal light propagating from the location. The detector detects the signal light that passes from the location through the signal-light optical system to the detector. The aperture plate is situated in the signal-light optical system, wherein the aperture (which can be variable) functions to remove all orders of diffracted light from the signal light except zeroth-order reflected light. The signal processor, to which the detector is connected, measures a spectral characteristic of the signal light from the detected signal light. The signal processor then calculates a parameter of the spectral characteristic that is a function of the thickness of the thin-film layer, and determines the thickness of the thin-film layer from the calculated parameter. This apparatus can be incorporated into an apparatus for planarizing the surface of a workpiece such as a wafer.

According to yet another aspect of the invention, methods are provided for measuring the thickness of at least one of an insulating layer and a metal electrode layer on a surface of a semiconductor device undergoing a process in which the layer (imprinted with a pattern) is being reduced in thickness (such as CMP). According to a representative embodiment of such a method, a probe light is illuminated onto at least a portion of a surface of the layer on the wafer so as to produce a signal light (e.g., an optical interference pattern) propagating from the layer. The signal light is detected, an intensity profile of the signal light is measured (desirably relative to wavelength), and a spatial coherence length of the signal light is determined. The spatial coherence length of the signal light is compared with a degree of fineness of the pattern illuminated by the probe light, and an optical model is determined based on the comparison. (The optical model is essentially a simulated distribution of features on the surface of the device, based on the particular waveform of signal light propagating from the actual surface of the device. The optical model is generated under the premise that it produces the same waveform of signal light as an actual corresponding device under the same incidence conditions of probe light. That is, signal light produced by the actual device and signal light produced by a surface according to the optical model would be substantially the same if the incidence conditions are the same.)

Based on the optical model, a theoretical intensity profile of the signal light is determined. The thickness of the layer and/or a process endpoint is determined by comparing the measured intensity profile of the signal light with the theoretical intensity profile of signal light. In such a method, the spatial coherence length of the probe light can be varied, desirably according to the degree of fineness of the pattern. The calculated theoretical intensity profile of signal light can be stored for later recall. The theoretical intensity profile can be calculated for a thickness of multiple films having an inter-film distance therebetween, wherein the comparison is made based on a similarity between the calculated theoretical intensity profile of signal light and the measured change in the signal-light intensity profile. Alternatively, a cross-correlation coefficient of the theoretical intensity profile of signal light and the measured intensity profile of signal light can be calculated. In the latter instance, the comparison can be made based on a similarity between a cross-correlation coefficient of a Fourier transform of the theoretical intensity profile of signal light and the measured intensity profile of signal light, and a position and magnitude of a Fourier component of the calculated theoretical intensity profile of signal light and a position and magnitude of a Fourier component of the measured intensity profile of signal light.

According to yet another aspect of the invention, apparatus are provided (in the context of an apparatus for planarizing a surface on a semiconductor wafer imprinted with a semiconductor device) for measuring a thickness of a layer on a surface of the semiconductor device imprinted on the wafer so as to provide a planarizing process endpoint. According to a representative embodiment, the apparatus comprises an illumination system, a measuring system, a numerical calculation system, and a detection system. The illumination system illuminates a probe light onto a portion of the surface of the layer on the wafer so as to produce a signal light propagating from the surface. The measuring system measures a change in an intensity of the signal light. The numerical calculation system is connected to the measuring system and calculates a theoretical intensity profile of signal light based on an optical model. The optical model is based on a comparison of a spatial coherence length of the probe light with a degree of fineness of a pattern for the semiconductor device illuminated with the probe light. The detection system detects at least one of a layer thickness and the process endpoint by comparing the measured intensity profile of signal light with the calculated theoretical intensity profile of signal light. A controller can be connected to the numerical calculation system and employed to control the spatial coherence length of the probe light. The controller can comprise a storage system (e.g., memory) that stores data concerning the calculated theoretical intensity profile of signal light. The detection system performs the comparison using a cross-correlation coefficient of the calculated theoretical intensity profile of the signal light and a measured intensity profile of the signal light. The detection system also performs a similarity comparison using a cross-correlation coefficient of a Fourier transform of the calculated theoretical intensity profile of the signal light and the measured intensity profile of the signal light, and/or a cross-correlation coefficient of a position and magnitude of a Fourier component of the calculated theoretical intensity profile of the signal light and a position and magnitude of a Fourier component of the measured intensity profile of the signal light.

The foregoing and other features and advantages of the invention will be more readily apparent from the following detailed description, which proceeds with reference to the accompanying drawings.

DETAILED DESCRIPTION

The present invention is described below in the context of multiple representative embodiments and examples. However, it will be understood that the scope of the invention is not limited to these embodiments.

For performing optical measurements according to the invention, a light source is desirably used that produces a continuous illumination light ("probe light") consisting of multiple wavelengths. The probe light, desirably in the form of a beam of light, is directed to the surface ("target surface") of a workpiece undergoing polishing or other processing step.

Probe light reflected from the target surface or transmitted through the target surface (i.e., "signal light") has a wavelength-dependent profile of any of various characteristics ("spectral characteristics") relative to the incident probe light that is characteristic of the surface. For example, a particularly useful spectral characteristic is wavelength-dependent reflectance (i.e., spectral reflectance). The spectral characteristics useful in the present invention can be detected directly and/or calculated from data provided by a suitable detector. An electrical signal resulting from such detection and/or data processing can be subjected to signal processing to extract data concerning the target surface, including the thickness and patterning of one or more thin-film layers on the target surface.

The probe light is not limited to visible light. For example, for probe light illuminated onto the rear side of the workpiece (to allow detection of signal light produced by transmission of probe light through the workpiece), infrared light may be most effective.

The spot diameter of probe light incident on the target surface is desirably larger than the minimum feature size of any pattern imprinted on the target surface. This desirably allows at least several periods of the incident probe light to be illuminated on the target surface.

Figure 1:
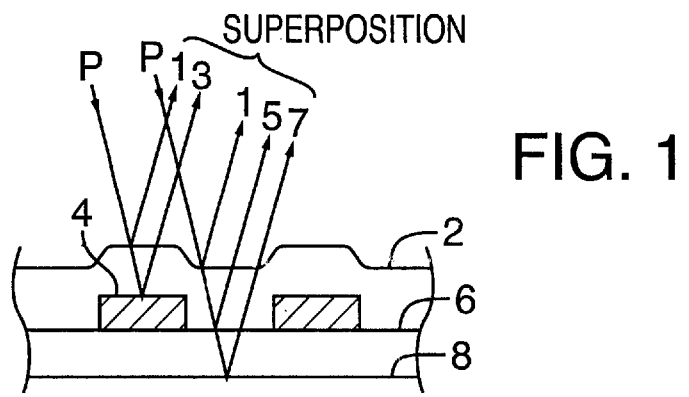
FIG. 1 shows a probe light P incident on a target surface to produce rays of signal light reflected from the target surface as well as various depths below the target surface.

Typically, the target surface of a semiconductor wafer or analogous workpiece comprises a laminate of multiple thin-film layers each defining a respective pattern extending in two dimensions. Each layer typically has a respective pattern. The patterns are typically interconnected with each other in three dimensions. As shown schematically in FIG. 1, a probe light P is incident on a target surface to produce rays of signal light 1, 3, 5, 7 reflected from the target surface. The signal light comprises light reflected from various surfaces 2, 4, 6, 8. For example, some of the signal light 1 is produced by reflection of probe light P from the surface 2 of an outermost layer on the target surface. Other signal light 3, 5, 7 is produced by reflection of probe light from surfaces 4, 6, 8, respectively, of one or more layers situated beneath the outermost layer. Such reflection from multiple layers results in a signal light having a complex interference pattern. A spectral characteristic (e.g., spectral reflectance) of signal light reflected from a target surface as shown in FIG. 1 usually differs greatly from a similar spectral characteristic of signal light reflected from a "blank" target surface. (A "blank" target surface is a planar surface. It can be patterned but is desirably not patterned.)

Calculating the thickness of a patterned layer on the target surface directly from the spectral characteristic of signal light reflected from such a target surface is difficult. In such calculations, the spectral characteristic of signal light reflected from a patterned layer of a prescribed thickness is measured. The pre-determined spectral characteristic is compared to a similar spectral characteristic of signal light reflected from such a layer undergoing a change such as polishing. Such methods require execution of a complicated and time-consuming procedure of inputting the necessary parameters for performing the necessary calculations. Such procedures are also prone to introduction of errors, resulting in low measurement accuracy.

Methods and apparatus according to the invention can be applied to measurements of signal light reflected from the target surface as well as of signal light transmitted through the target surface. The various embodiments described herein introduce substantial simplifications to prior-art methods and apparatus and provide substantial improvements in measurement accuracy.

For simplicity, much of the following discussion of the various embodiments is directed to measurements of reflected signal light. However, it will be understood that the principles of the invention can be applied with equal facility to measurements of transmitted signal light.

In the various embodiments, a probe light comprising multiple wavelengths is illuminated onto a target surface of a workpiece. For simplicity, the workpiece is generally referred to herein as a "wafer." However, it will be understood that the workpiece can be any of various objects that can be subjected to a polishing operation or analogous process in which monitoring of changes to the surface thereof is desirable.

In certain embodiments of the invention, of the probe light incident on the target surface, only the zeroth order of the reflected signal light is detected. Certain spectral characteristics (e.g., spectral reflectance) of zeroth-order signal light from the target surface changes in a complex manner, due to interference, with respect to the wavelength of the probe light. However, in plots of such spectral characteristics (e.g., reflectance) versus wavelength of reflected zeroth-order light, notable maxima and minima are exhibited.

To a first approximation, the spectral reflectance of reflected zeroth-order signal light from the target surface comprises multiple interference components generated by probe light passing through the thickness dimension of the uppermost layer on the target surface. Other interference components are contributed by probe light scattered by bumps in the uppermost layer, and by probe light reflected from pattern features in underlying layers.

For maximal accuracy when monitoring changes to a target surface (such as during polishing of the target surface), it is desirable that the selected spectral characteristic change rapidly over the time during which the target surface is changing and measurements are being obtained. For example, it is desirable that the selected spectral characteristic change rapidly during polishing of the target surface up to the moment planarization of the target surface is achieved.

First Embodiment

In this embodiment, wavelengths corresponding to local maxima of the spectral reflectance and wavelengths corresponding to local minima of the spectral reflectance are obtained by processing a spectral reflectance signal within the measurement wavelength range. Such local maxima and minima (along with their corresponding wavelengths) are used as measurement parameters of the spectral characteristic. For example, a polishing endpoint for a patterned wafer undergoing CMP can be detected with high accuracy by monitoring changes in the local maxima signals or changes in the local minima signals.

Besides simply local maxima and local minima of spectral reflectance, other useful parameters for measurement purposes are differences (e.g., local maximum−local minimum) and quotients (e.g., local maximum/local minimum). Also, in place of local maxima, the largest local maximum obtained in the measured wavelength range of the spectral reflectance can be used as a measurement parameter. Similarly, in place of local minima, the smallest local minimum obtained in the measured wavelength range of the spectral reflectance can be used as a measurement parameter. Yet other useful parameters are the difference (global maximum−global minimum) and the quotient (global maximum/global minimum). As used herein, a "global maximum" is the maximum, of all the maxima in the spectral signal, having the greatest magnitude; similarly, a "global minimum" is the minimum, of all the minima in the spectral signal, having the lowest magnitude.

Whenever a signal change in the local maxima or global maximum, or (global maximum−global minimum), or (global maximum/global minimum) is used, the polishing endpoint can be detected with a high degree of accuracy by detecting the time during polishing at which these parameters rapidly increase.

Whenever a signal change in the local minima or a global minimum is used, the polishing endpoint can be detected with a high degree of accuracy by detecting changes in any of these parameters with time.

By illuminating a probe light having a spot diameter larger than a feature size onto a patterned wafer (or other workpiece) and measuring the reflected signal light, the measured reflected signal light will contain a pattern-interference component. The pattern-interference component is generated by interference of a pattern-diffraction component and a component generated by the thin film on the wafer surface. During polishing, as the wafer surface is planarized, the amount of light scattered from the surface decreases and the diffraction efficiency increases. This diffracted light increases the local maxima of the zeroth-order light and decreases the local minima of the zeroth-order light. These parameters rapidly increase or decrease around the process endpoint.

Second Embodiment

In the second embodiment, the wavelength dispersion of a reflectance signal (as a representative spectral characteristic) within the wavelength range of probe light is used as a measurement parameter. The dispersion of the wavelength of the resulting signal light changes as polishing progresses. The dispersion of signal-light wavelength exhibits a rapid change immediately before and after the polish endpoint is reached. Therefore, by monitoring the wavelength dispersion of the signal light and detecting when the dispersion exhibits a rapid change, the polish endpoint can be detected with high accuracy.

A suitable measure of wavelength dispersion is the standard deviation or variance of the signal-light wavelength. As the surface of the wafer is being polished, the signal-light dispersion exhibits a change. The dispersion exhibits a rapid increase immediately before and after the surface of the wafer is planarized. As in the first embodiment, the effect of pattern interference appears prominently immediately before and after planarization is achieved during polishing. The reflectance also changes rapidly with respect to wavelength as polishing progresses, which is believed to be the cause of the increase in spectral reflectance.

Third Embodiment

In the third embodiment, the waveform of the spectral reflectance (as a representative spectral characteristic) of signal light is subjected to Fourier-transformation. An appropriate wavenumber component of the Fourier-transformed waveform is used as a measurement parameter. The wavenumber component rapidly increases immediately before and after the wafer surface reaches a planar condition.

This rapid increase is believed to be caused by the rapid increase in the interference component arising from the inter-pattern interference of the spectral reflectance signal immediately before and after the wafer surface is planarized.

The wavenumber component of the wave number that most rapidly increases immediately before and after the wafer surface is planarized can be determined for use as a measurement parameter by routine experiments and/or simulations.

Fourth Embodiment

In the fourth embodiment, a cross-correlation function is used as a measurement parameter. The cross-correlation function of this embodiment is of the waveform of the spectral reflectance as measured in situ (i.e., while CMP or other process is ongoing) and a reference spectral reflectance previously obtained by measurement (and stored, for example, in a memory). The reference spectral reflectance can also be obtained by a simulation calculation based on various data such as the dimensions of the device pattern at the time polishing or analogous process is terminated.

The waveform of the spectral reflectance changes as polishing progresses. The cross-correlation function generally exhibits a local maximum at the process endpoint. By detecting the instant at which the cross-correlation function exhibits a local maximum, the process endpoint can be detected with high accuracy.

The embodiments described above, based on parameters involving pattern-diffraction phenomena, are useful for detecting the process endpoint when planarizing a dielectric layer such as $SiO_2$. The methods are also useful for monitoring removal of residual metal left over on the surface of the workpiece from a plug-forming step or similar step. During removal of such metal or of a metal layer, the wavelength-dependent profile of the parameter undergoes a rapid change as the underlying device pattern becomes revealed as polishing progresses from a starting condition in which the entire surface is a metal-layer surface. Thus, under such polishing conditions, the process endpoint is detectable with even greater accuracy.

EXAMPLE 1

Figure 2:
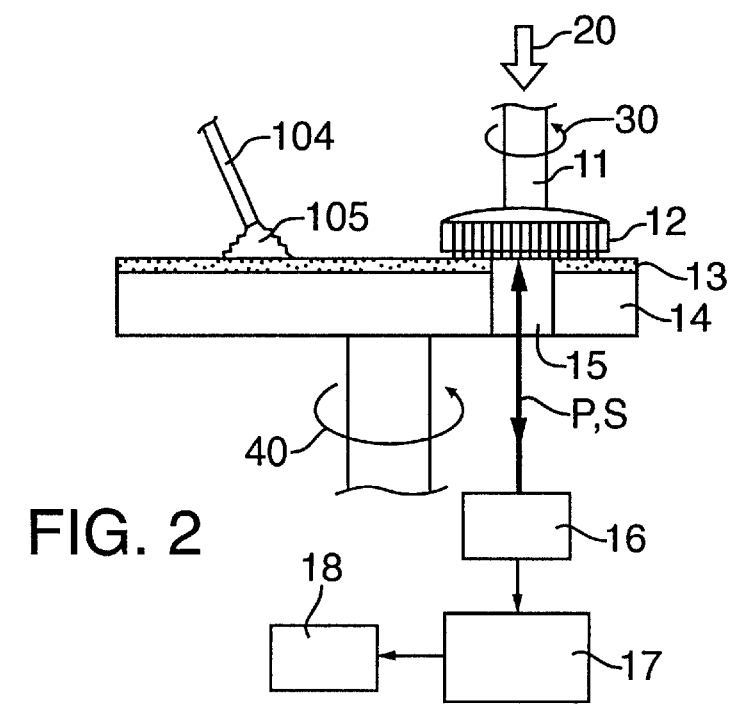
FIG. 2 shows certain aspects of the measurement apparatus used in Example 1.

In this example, a 6-inch wafer was destined for use as an image-pickup device. A $SiO_2$ layer, applied to the wafer for use as an interlayer insulator, was subjected to polishing by CMP. The polishing endpoint was detected. FIG. 2 shows certain aspects of the measurement apparatus used in this example, and FIG. 3 shows certain details of the measuring optical system used in the FIG. 2 apparatus.

In FIG. 2, a polishing pad 13 is affixed to a polishing plate 14. A wafer 12 is mounted to a polishing head 11. By rotating the polishing head 11 and the polishing plate 14, a relative motion is created between the wafer 12 and the polishing pad 13 to polish the wafer 12. As shown in FIG. 1, an opening (desirably about 2 cm in diameter) is defined in the polishing plate 14 to transmit a beam of probe light through the polishing plate 14 to the wafer surface. The polishing pad 13 is made of an epoxy resin and contacts the bottom surface of the wafer 12. A transparent window 15 (made of quartz) is provided in the opening in the polishing plate 14. At the polishing surface of the polishing pad 13, the window 15 is coplanar with the polishing surface 13.

Figure 3:
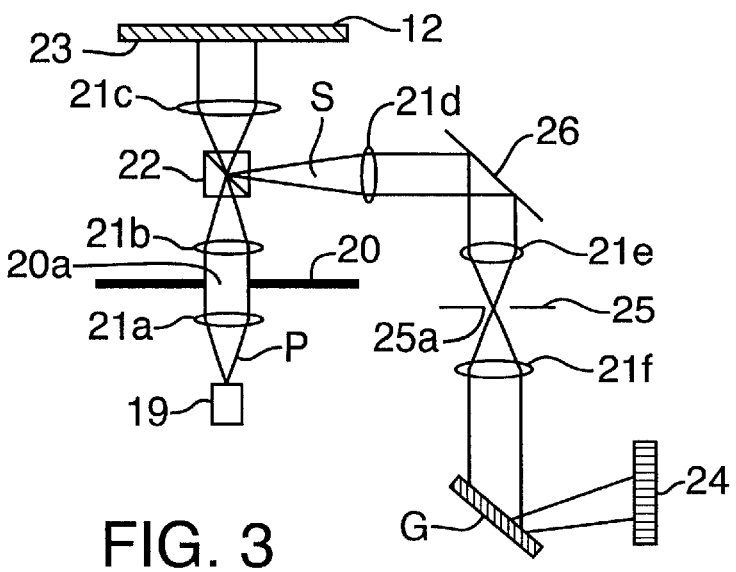
FIG. 3 shows certain details of the measuring optical system used in the FIG. 2 apparatus.

Turning now to FIG. 3, a halogen lamp 19 projects a probe light P through lenses 21a–21c and through a beamsplitter 22 vertically onto the surface 23 of the wafer 12. The signal light S reflected by the surface 23 passes through the lens 21c and is reflected by the beamsplitter 22. The signal light S then passes through a lens 21d, is reflected by a mirror 26, passes through a lens 21e, passes through a pinhole 25a defined by a plate 25 (that blocks scattered and diffracted light), and passes through a lens 21f to a diffraction grating G. The diffraction grating G resolves the wavelengths of the signal light S to allow different wavelengths to propagate in different directions toward a linear sensor 24 (e.g., optical diode or "512" device) that detects the various separated wavelengths of signal light. The wavelength-measurement range of the sensor 24 is approximately 400 nm to 700 nm in this example. The probe light P incident on the wafer 12 has a diameter of about 1 mm. The spectral-reflectance signal output from the linear sensor 24 is amplified and routed to a signal processor 17 that calculates therefrom a useful measurement parameter. The signal processor 17 also determines the polishing endpoint from the temporal change in the measurement parameter as a function of the thickness of the layer being polished. The signal processor 17 also outputs a control-related signal such as the spectral reflectance as a function of time or film thickness to a display 18 if desired.

During polishing, a dispenser 104 discharged a CMP polishing slurry 105 onto the surface of the wafer 12. The slurry was an alkaline aqueous suspension of silica particles. During polishing, the pressure applied by the polishing pad 13 to the wafer surface was about 100 grams per square cm. Loss of probe light P due to the abrasive slurry (mainly due to scattering) was below 1 percent.

Figure 4A:
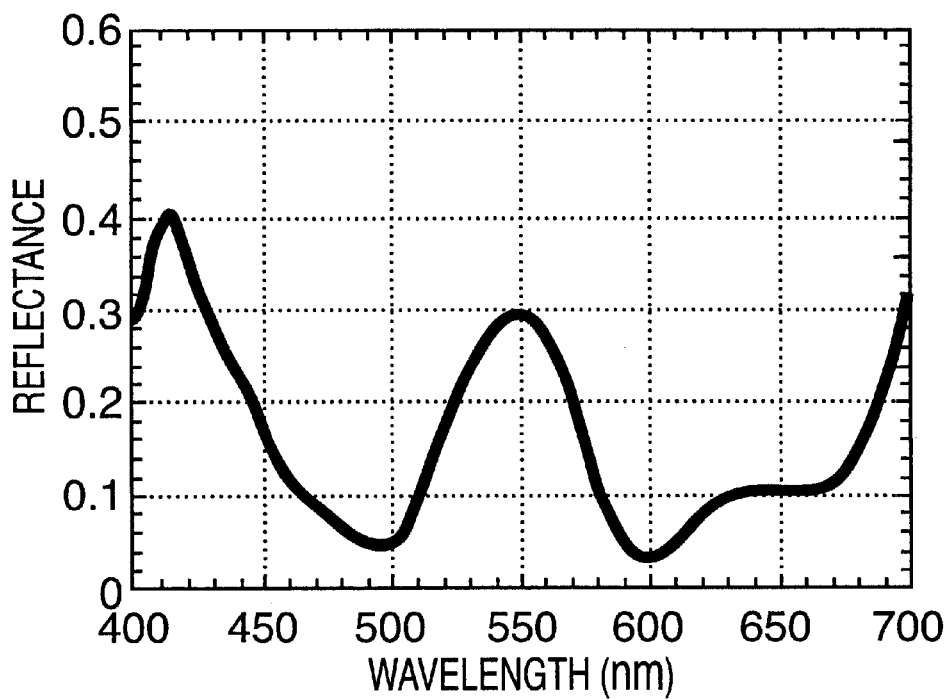
FIG. 4(a) is a plot of a waveform-dependent profile of the spectral reflectance of a wafer in a pre-polish state as described in Example 1.
Figure 4B:
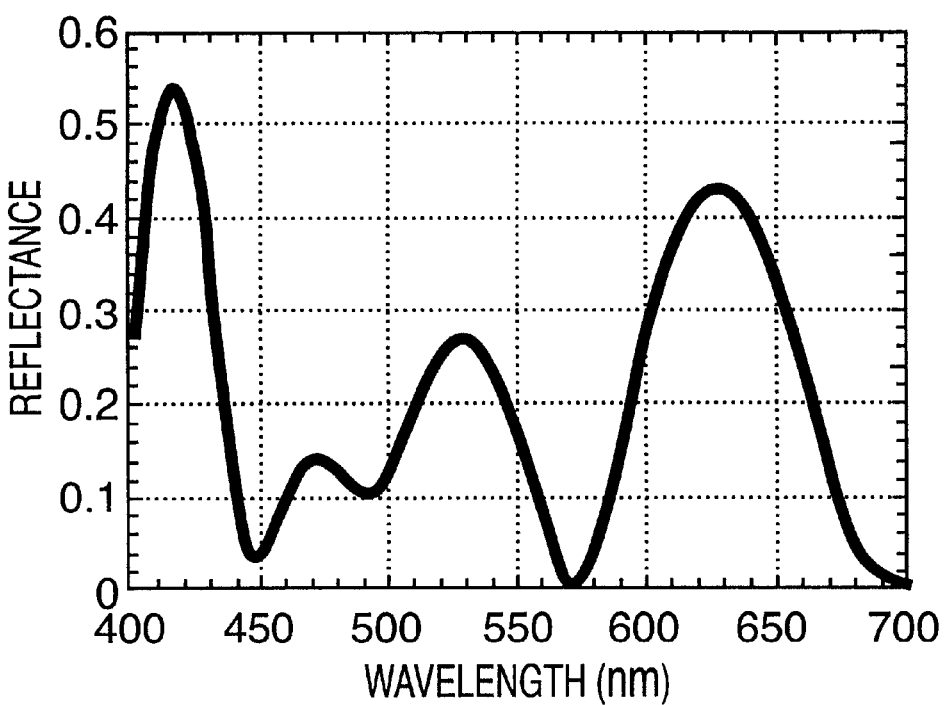
FIG. 4(b) is a plot of the waveform-dependent profile of the spectral reflectance of a wafer in a post-polish state as described in Example 1.

The surface of the wafer 12 subjected to polishing was a 1000-nm thick $SiO_2$ insulating layer applied by chemical vapor deposition over a patterned metal layer 500 nm thick. Thus, the wafer 12 had steps about 500 nm high on its surface. To polish such a surface, the polishing pad 13 was hard. Polishing resulted in a satisfactory degree of planarization, in which the steps were reduced to less than 10 nm. The signal waveform of the spectral reflectance changed from a pre-polish state as shown in FIG. 4(a) to a post-polish state as shown in FIG. 4(b).

From the spectral reflectance data, the signal processor 18 calculated an appropriate measurement parameter. By monitoring the measurement parameter as polishing progressed, the polishing endpoint was determined easily with high accuracy.

EXAMPLE 2

Figure 5:
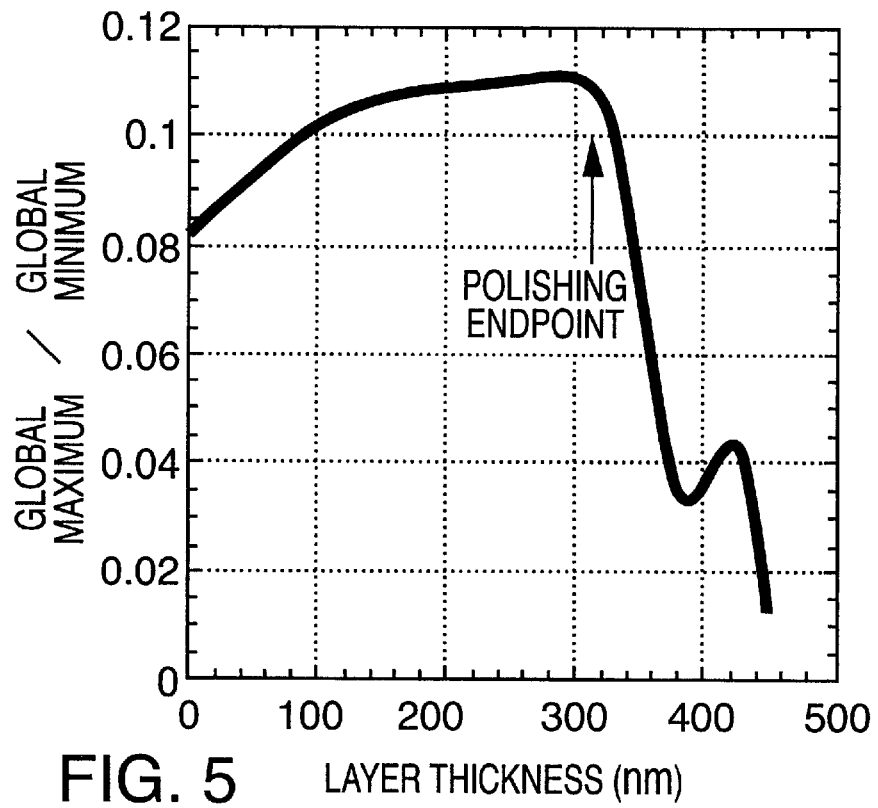
FIG. 5 is a plot, with respect to Example 2, of the change in the measurement parameter (global maximum spectral reflectance/global minimum spectral reflectance) with respect to layer thickness as polishing progressed. The polishing endpoint is indicated with an arrow.

This example differs from Example 1 in that, in Example 2, the quotient (global minimum spectral reflectance)/(global maximum spectral reflectance) was used as the measurement parameter. The signal processor 17 (FIG. 2) calculates local minima and local maxima by differentiating the spectral reflectance signal. From such local minima and maxima, the signal processor 17 obtains the global maximum, the global minimum, and the quotient (global maximum/global minimum). To obtain the global maximum and global minimum, the signal processor compares each value of the local maxima and the local minima, respectively. The signal processor then determines which local maximum has the greatest signal magnitude and identifies that particular local maximum as the global maximum, and determines which local minimum has the lowest signal magnitude and identifies that particular local minimum as the global minimum. The measurement parameter (global maximum/global minimum) is monitored with respect to the thickness of the layer being polished as polishing progressed. FIG. 5 depicts the change in the quotient with respect to layer thickness as polishing progressed. As shown in FIG. 5, the quotient exhibits a rapid decrease around the polishing endpoint (at which time the surficial steps had been eliminated by polishing). Thus, by monitoring the quotient in the vicinity of the polishing endpoint, the moment to cease polishing is determined easily with high accuracy.

Figure 6:
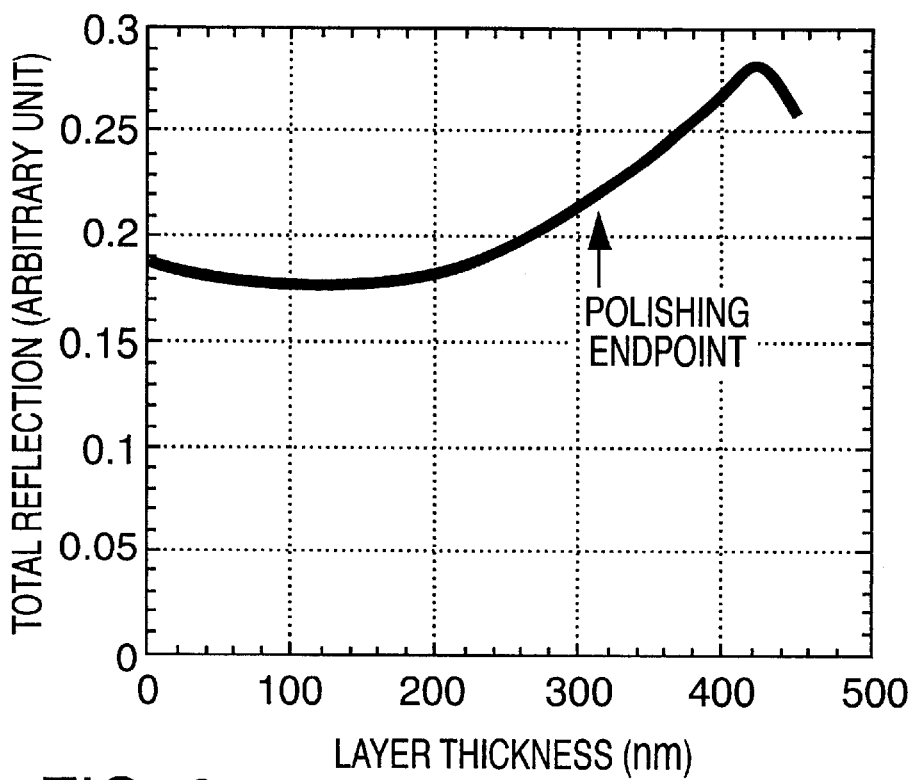
FIG. 6 is a plot, with respect to Example 2, of the change in intensity of total reflection with respect to layer thickness as polishing of the layer progressed. The polishing endpoint is indicated with an arrow.

FIG. 6 shows the change in intensity of total reflection with changes in the thickness of the layer being polished. The polishing endpoint is indicated with an arrow. Since total reflection changes slowly in the vicinity of the polishing endpoint, this parameter is not as suitable for accurately determining polishing endpoint as the quotient parameter shown in FIG. 5.

EXAMPLE 3

This example differs from Example 1 in that, in Example 3, the wavelength dispersion of the spectral reflectance was determined for each measured value of the spectral reflectance, and the dispersion values were used as the measurement parameter. (The wavelength dispersion of the spectral reflectance is the variance of reflectance as measured over a range of wavelengths, i.e., over a spectral range. The "variance" is the square of the standard deviation, as known in the art.)

Figure 7:
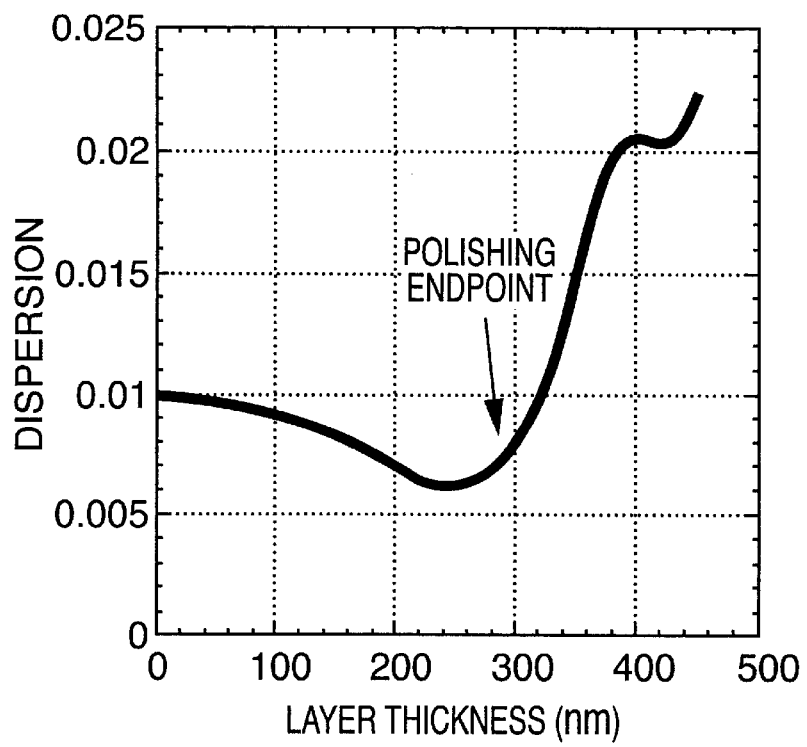
FIG. 7 is a plot, with respect to Example 3, of the change in dispersion of the spectral reflectance with respect to layer thickness as polishing of the layer progressed. The polishing endpoint is indicated with an arrow.

FIG. 7 is a plot of the change in dispersion of the spectral reflectance signal with changes in the thickness of the layer being polished. The polishing endpoint is indicated with an arrow. As shown in FIG. 7, the parameter rapidly increases in the vicinity of the polishing endpoint. Thus, the polishing endpoint is detected with high accuracy.

EXAMPLE 4

This example differs from Example 1 in that, in Example 4, the spectral reflectance signal is Fourier-transformed and an appropriate wavenumber component of the Fourier-transformed spectral reflectance signal is used as the measurement parameter.

The Fourier transform was calculated using the following equation $$F(k) = \frac{1}{2\pi} \int_{-\infty}^{\infty} f(\lambda) e^{-ik\lambda} d\lambda \qquad (1)$$

In the foregoing equation, $\lambda$, $k$, $f(\lambda)$, and $F(k)$ are the wavelength, the wavenumber, the spectral reflectance (wavelength-dependent reflectance spectrum), and the Fourier transform of $f(\lambda)$, respectively. In this example, the Fourier transform of $f(\lambda)$ was calculated from the spectral reflectance signal obtained at discrete wavelengths over a wavelength range.

The manner in which the optimal wavenumber is determined depends on the profile and dimensions of the pattern defined by the surficial layer on the wafer. Hence, the optimal wavenumber component can be calculated from the profile and dimensions of the pattern. However, multiple wavenumber components can be selected, and changes in each wavenumber component can be simulated with respect to the change in the thickness of the layer being polished. In this instance, the wavenumber component having a plot that changes most rapidly in the vicinity of the polishing endpoint desirably is selected as the optimal wavenumber component.

Figure 8:
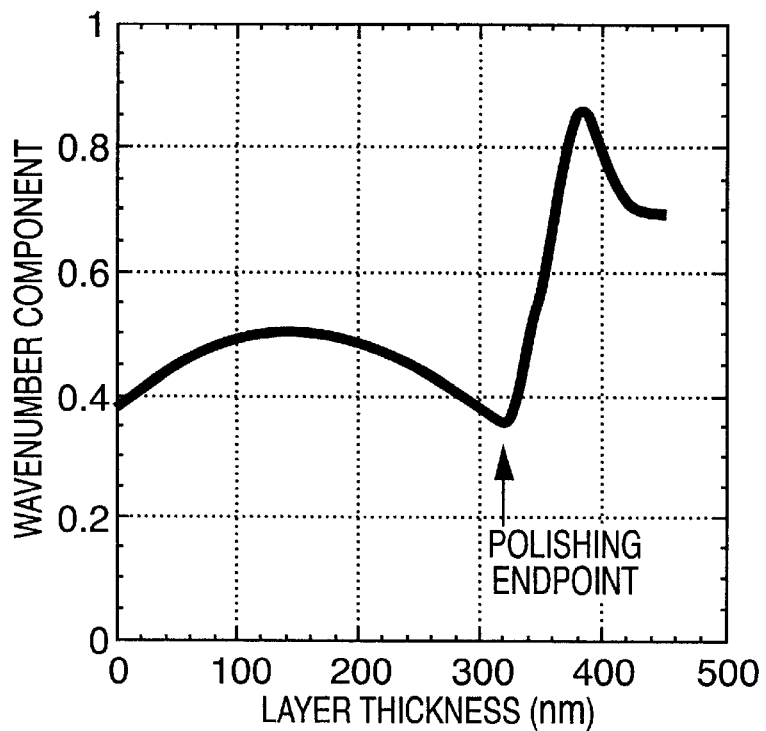
FIG. 8 is a plot, with respect to Example 4, of a suitable wavenumber component of a Fourier transformation of the spectral reflectance, with respect to layer thickness as polishing of the layer progressed. The polishing endpoint is indicated with an arrow.

As shown in FIG. 8, the measurement parameter rapidly changed in the vicinity of the polishing endpoint. Thus, the polishing endpoint was easily detectable with high accuracy.

EXAMPLE 5

This example differs from Example 1 in that, in Example 5, a cross-correlation function was calculated and used as the measurement parameter. The cross-correlation was of the spectral reflectance signal that changes with corresponding changes in layer thickness and a reference spectral reflectance signal (previously obtained and stored) corresponding to the polishing endpoint.

A plot (not shown) of the cross correlation function revealed that the spectral reflectance signal that changes with corresponding changes in layer thickness coincides approximately with the stored reference spectral reflectance signal obtained at the polishing endpoint. The cross-correlation function also rapidly increased in the vicinity of the polishing endpoint. By detecting an appropriate point in the vicinity of the polishing endpoint, it was thus possible to determine easily, with high accuracy, when to terminate polishing.

The cross-correlation function was defined by the following equation:

$$R_{xy}(\tau) = \int_{-\infty}^{\infty} f(\lambda)g(\lambda + \tau)d\lambda \quad (2)$$

wherein $f(\lambda)$, $g(\lambda)$, and $R_{xy}(\tau)$ represent the spectral reflectance signal that changes as polishing progresses, the reference spectral reflectance signal, and the defining equation of the cross-correlation function, respectively. The cross-correlation coefficient is defined as the value of the cross-correlation function in which $f(\lambda)$ differs from $g(\lambda)$ by the wavelength $\tau$.

The reference spectral reflectance can be obtained by simulation but also can be obtained in advance by measurement.

Although methods as exemplified in each of the foregoing examples can be used independently, the methods can also be used in combination to achieve satisfactory results.

Fifth Embodiment

Certain features of a polishing apparatus according to this embodiment are shown in FIG. 2. The FIG. 2 apparatus is operable to detect the thickness of a surficial layer or a process endpoint. As summarized above, the FIG. 2 embodiment comprises a polishing head 11 for holding a wafer 12 as a workpiece and for urging the wafer 12 against a polishing pad 13. The polishing pad 13 is mounted to a polishing plate 14. Extending through the polishing plate 14 and the polishing pad 13 is a translucent window 15. Probe light P reflected from the surface of the wafer 12 passes through the window 15 and is received by a light sensor 16. The light sensor 16 is connected to a signal processor 17, which is connected to a display 18. The FIG. 2 apparatus also comprises a wafer-rotation mechanism (only the rotation direction 30 is shown) that creates a relative motion between the polishing pad 13 and the wafer 12, and a polishing-plate-rotation mechanism (only the rotation direction 40 is shown). As the wafer 12 is being polished, the wafer 12 is urged (arrow 20) against the surface of the polishing pad 13. Meanwhile, a relative motion between the polishing pad 13 and the wafer 12 is generated by the rotational motion 40 of the polishing pad 13 and the rotational motion 30 of the wafer 12. An abrasive slurry 105 is supplied from a dispenser 104. Probe light P and signal light S pass through the window 15 in order to detect the thickness of the surficial layer on the wafer 12 or the process endpoint as polishing is ongoing. Based on the signal processed by the signal processor 17, the thickness of the surficial layer on the wafer 12 is monitored.

In order to perform optical monitoring of the wafer 12, the probe light is desirably a continuous light having multiple wavelength components, e.g., a white light or spectral components of white light. A signal, corresponding to a spectral characteristic of the signal light reflected from the wafer 12, is processed by the signal processor 17. The probe light P may be illuminated either directly onto the surface of the wafer 12 (as shown), or onto the underside of the wafer 12 (in the latter instance, probe light transmitted through the wafer 12 is detected as signal light, and the probe light is preferably a multiple-component infrared light).

As discussed above, probe light reflected as signal light by the pattern on the surface of the wafer 12 can be regarded as a superposition of light waves reflected from each of multiple layers of laminated thin films on the wafer surface. Each layer defines a respective pattern. The waveform of a spectral characteristic of the signal light is a result of a complicated interference effect. Hence, the waveform of the spectral characteristic of signal light reflected by a patterned layer differs substantially from the waveform of the spectral characteristic of signal light reflected from a planar non-patterned layer (blank layer), even if the thickness of the patterned layer is the same as the thickness of the blank layer.

It is generally complicated to calculate the thickness of a selected patterned layer on the wafer 12 directly from the waveform of the spectral characteristic of the light reflected by the patterned layer. However, as discussed above, the spectral reflectance of signal light from an otherwise similar control patterned layer having a prescribed thickness can be pre-determined and used as a standard against which a measured spectral reflectance for a selected layer is compared. Hence, the thickness of the selected layer is measured with high accuracy. Polishing is terminated when the measured reflectance from the selected patterned layer matches the pre-calculated reflectance of the control.

A spectral reflectance for a particular sample workpiece can be measured using a dummy wafer. The spectral reflectance obtained with the dummy wafer can be used as a reference control for use when polishing other similar wafers.

Whenever a pattern on a wafer is a one- or two-dimensional periodic pattern distributed uniformly throughout the wafer surface (e.g., a DRAM pattern) and the area illuminated by the probe light is wider than the pitch of the pattern, a stable and position-independent signal can be obtained from average spectral reflectance values. Also, in such an instance, the layer thickness can be measured easily in situ (during polishing) because the same spectral reflectance waveform can be obtained by reflection of probe light from any location on the wafer (the pattern is the same over substantially the entire wafer surface).

But, if the pattern on the wafer is for, e.g., a microprocessor or ASIC chip in which the pattern is not uniformly distributed, the spectral waveform can differ substantially depending upon the specific location actually illuminated by the probe light. Despite such variability in the signal, it has been discovered that, with respect to microprocessor or ASIC patterns on a wafer surface, a reasonably stable and reproducible signal nevertheless can be obtained from the wafer surface. This is because the average pitch of patterns for such devices is typically about the same throughout, regardless of the non-uniformity of the pattern. We have analyzed the waveforms of signals from such patterns (spectral reflectance or spectral waveforms) and noticed that the profiles of such waveforms are greatly dependent upon the degree of fineness of the pattern. In other words, device patterns having approximately the same degree of fineness exhibit approximately the same spectral waveform.

In performing a measurement using probe light that impinges orthogonally onto the wafer surface, the layer thickness and the feature density of the pattern on the wafer surface (in addition to the degree of fineness) influence the waveform obtained from the probe light. Here the feature density is defined as the proportion of the total pattern occupied by pattern features (which typically appear as raised areas on the surface of a wafer that has not yet been planarized). The raised areas corresponding to pattern features are usually formed of a layer of a dielectric superposed on a metal layer. Normally, during formation of such layers, the film thickness is substantially uniform over the wafer surface, and the feature density is in the range of 30 to 50%. It has been discovered that the influence of these factors on the position dependency of the spectral waveform is not significant.

Figure 9A:
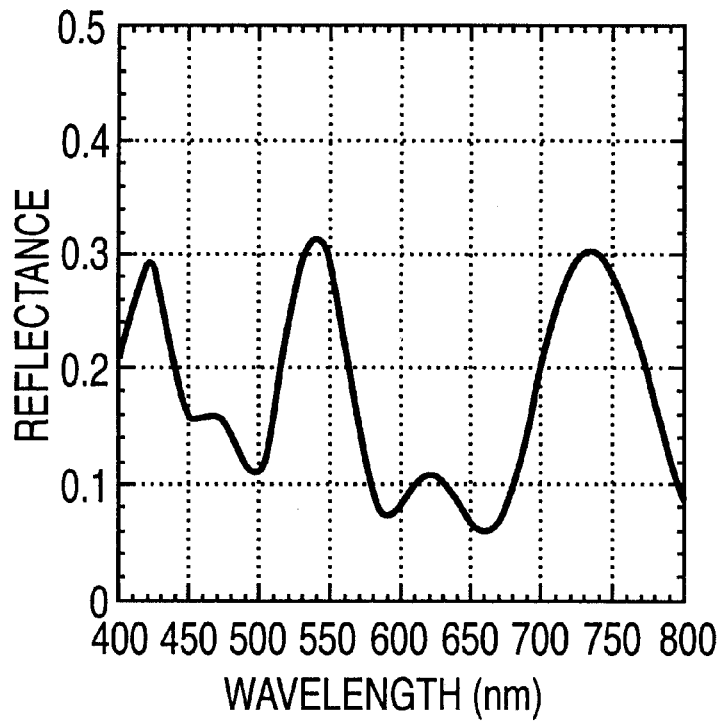
FIG. 9(a) is a plot, with respect to the Fifth Embodiment, of reflectance as a function of wavelength of signal light produced by reflection of probe light from a wafer surface imprinted with a pattern having an extremely fine pitch, such as that of memory cells.
Figure 9B:
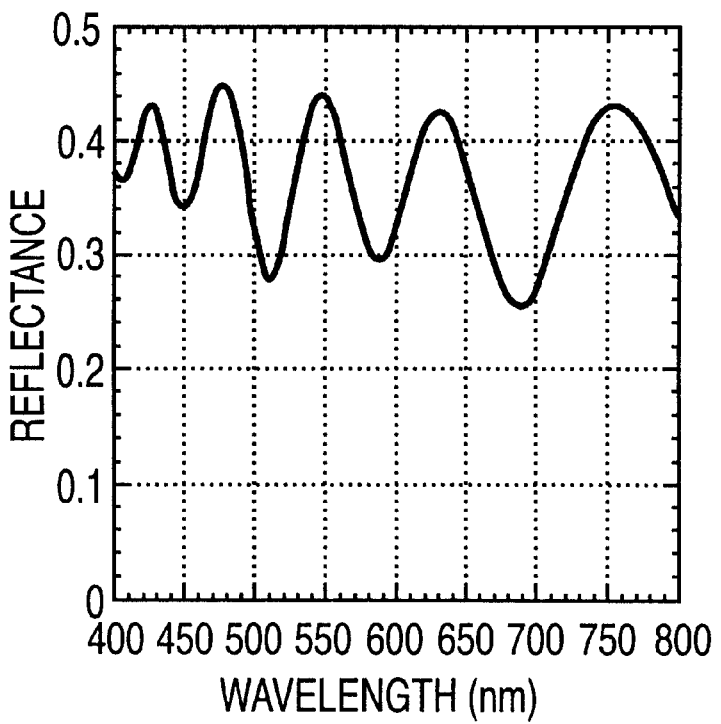
FIG. 9(b) is a plot, with respect to the Fifth Embodiment, of reflectance as a function of wavelength of signal light produced by reflection of probe light from a wafer surface imprinted with a pattern having a coarse pattern pitch, such as that of a wiring layer.

For example, spectral reflectance data were obtained with representative device patterns on a wafer. Two patterns were evaluated, both having the same layer thickness and feature density. One pattern had an extremely fine pattern pitch such as that of memory cells (FIG. 9(a)), and the other had a coarse pattern pitch such as that of a wiring layer (FIG. 9(b)). Comparing FIG. 9(a) with FIG. 9(b), a distinctive difference was observed in the waveform obtained with each of these patterns. Based on this observation, it was discovered that the degree of fineness of the pattern has a greater influence on the overall waveform than the feature density.

Therefore, the reflectance of probe light from a pattern on a wafer is dependent upon the degree of fineness of the device pattern and results from differences in the interference phenomena exhibited by probe light reflected from such patterns. In this regard, it will be recalled in the discussion above regarding FIG. 1 that light reflected from a patterned laminate of thin films is a superposed interference phenomenon. The interference is due to amplitude splitting due to the thickness of the layers and wave-surface splitting due to interaction of probe light with the features of the pattern. These pattern-dependent interference phenomena are generated between features within the spatial coherence length of the illuminating optical system. (The "spatial coherence length" is a distance, on the device pattern, in which light irradiated onto the pattern has coherency.) Therefore, these pattern-dependent interference phenomena do not occur when the feature width is larger than the spatial coherence length.

With a coarse pattern having a large feature width, the spectral waveform appears to be determined by the sum of all the light intensities from the features of the pattern. This was confirmed by comparing actual measurement data with results obtained in a simulation calculation using a mathematical model based on interference caused by amplitude splitting, interference caused by wave-surface splitting, and the coherence length.

Sixth Embodiment

According to this embodiment, a determination is made of whether probe light is properly illuminated on a device pattern on a wafer workpiece based on the spectral waveform of reflected probe light from the pattern. If the probe light is actually incident on a device pattern, then a determination is made of which portion of the pattern is being illuminated by the probe light (e.g., region A, B, C, D, E, or F in FIG. 10). The illumination position of the probe light can then be specified.

Based on the illumination position of the probe light, the model calculation by which the layer thickness is calculated can be adjusted or changed as needed. Moreover, the target waveform at the process endpoint is also selected based on the location on the workpiece illuminated by the probe light. Thus, the polishing process can be controlled by detecting layer thickness and process endpoint regardless of the location on the workpiece illuminated by the probe light.

Detection is facilitated by specifying the location on the workpiece (i.e., the specific portion of the pattern on the workpiece) to be illuminated by the probe light. Such a specification is based on the obtained spectral waveform. Multiple calculations are performed using the respective target waveforms corresponding to the various illumination locations on the device pattern. When these methods are used with an apparatus having a mechanism for changing the illumination location of the probe light on the workpiece, a desired location can be illuminated with the light by conducting a time-series analysis of the respective spectral waveform.

In the case of an in-situ measurement conducted during polishing, data from various locations on the workpiece are continuously acquired since the illumination location cannot be controlled under such conditions. However, by determining and specifying the illumination location based on the spectral waveform and processing the data corresponding to the illumination location, the process can be controlled. For example, only data from the same location on the workpiece can be selected each time for processing (e.g., any of the regions A, B, C, D, E, and F shown in FIG. 10). Alternatively, data acquired from various locations (e.g., any of the regions A, B, C, D, E, and F shown in FIG. 10) can be segregated out for individual processing.

Specific parameters useful for determining and specifying the illumination location based on the spectral waveform are listed below:
 (1) difference between the largest local maximum and the smallest local minimum;
 (2) ratio of the smallest local minimum to the largest local maximum; and
 (3) smallest local minimum.

One or more parameters can be selected from the foregoing list. The value of the selected parameter obtained from the spectral waveform by signal processing is compared with a previously stored value obtained by measurement or simulation calculation at a different pattern location. Thus, the illumination position is determined and specified.

This embodiment can be applied not only to dielectric layers (e.g., inter-layer insulating films) but also to metal layers. For example, in forming an electrode-layer inlay in an integrated circuit, a metal layer is laminated over the entire surface of the wafer. Most of the metal is subsequently removed by etching or polishing, which leaves only certain portions of the surface covered with the metal. The spectral waveform of signal light reflected by a metal film is usually smooth. When a portion of the metal layer is removed to reveal the pattern, the spectral waveform of signal light reflected from the surface becomes influenced by the underlying dielectric layer. As a result, the spectral waveform of the reflected signal light changes significantly. By observing this change, the measurement location on the metal layer of each pattern can be ascertained effectively.

Whenever the illumination location can be determined and specified from the spectral waveform, one or more appropriate parameters are then obtained from the spectral waveform by signal processing. Each selected parameter is then used to monitor the process endpoint. It is desirable that the parameter(s) be selected from the following list:
 (1) one or more parameters selected from the set {local maximum, local minimum, (local maximum–local minimum), (local minimum/local maximum)};
 (2) one or more parameters selected from the set {largest local maximum, smallest local minimum, (largest local maximum–smallest local minimum), (smallest local minimum/largest local maximum)};
 (3) a dispersion (variance);
 (4) a component of a Fourier transform (e.g., of spectral reflectance); and
 (5) a cross-correlation function of the spectral waveform with a previously obtained spectral waveform obtained by, e.g., a simulation calculation.

The parameter used to detect the process endpoint may be the same as the parameter used to determine a measurement location but may be different from the parameter used to determine the measurement position.

Although this embodiment was described in the context of a polishing process using an apparatus as shown, e.g., in FIG. 2, this embodiment can be used with equal facility with any of various other apparatus that impart a physical change to the workpiece surface, such as an ion-etching apparatus or the like.

EXAMPLE 6

Figure 10:
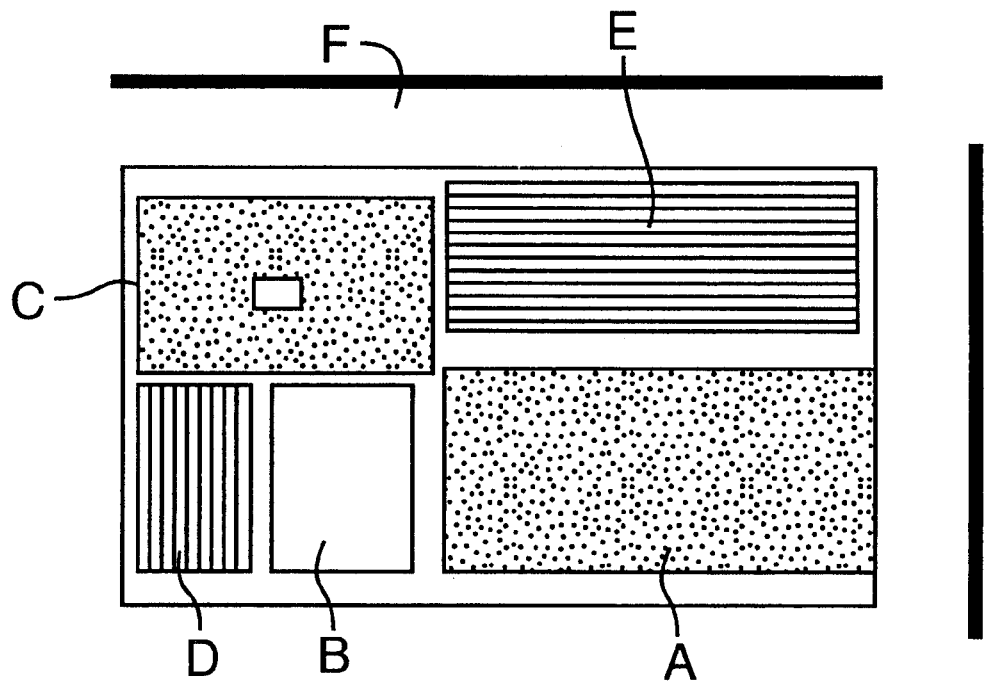
FIG. 10 is a schematic plan view, with respect to the Sixth Embodiment and Example 6, of various regions of a representative device pattern, such as a pattern for a microprocessor.

In this example, a $SiO_2$ inter-layer insulating film for an image-pickup device was layered on a 6-inch diameter wafer. An image-pick-up device has a layout as shown in FIG. 10. The regions A, B, and C have a high degree of fineness and contain active devices, capacitors, and the like. The regions D, E, and F have a low degree of fineness and contain wires and the like.

The wafer was polished using a polishing apparatus as shown in FIG. 2 and described above.

The measurement system was configured as shown in FIG. 3 and described above. The wavelength range of probe light in this example was 400 nm to 800 nm. The spot diameter of probe light on the wafer 12 was about 2 mm. Reference data obtained from the spectral waveform measured from the pattern of the present image-pickup device was pre-stored in the signal processor 17. This reference information was used as a reference value for signal processing.

The polishing slurry used in this example was an alkaline suspension of silica particles. The polishing pressure applied to the wafer 12 during polishing was about 100 g/cm². The amount of probe light lost (mainly due to scattering) due to the presence of polishing slurry was below 1%.

Using the above-described apparatus, a preliminary measurement was performed on a sample wafer having the same pattern (image-pickup device) and shape as the product wafer. A $SiO_2$ insulating film was formed on the top surface of the sample wafer to about 1000 nm thick by CVD. The sample wafer was then polished. Polishing was terminated when the $SiO_2$ insulating film thickness was reduced to about 500 nm, and spectral waveform signals were obtained. The obtained spectral waveform signals were then analyzed.

Figure 11A:
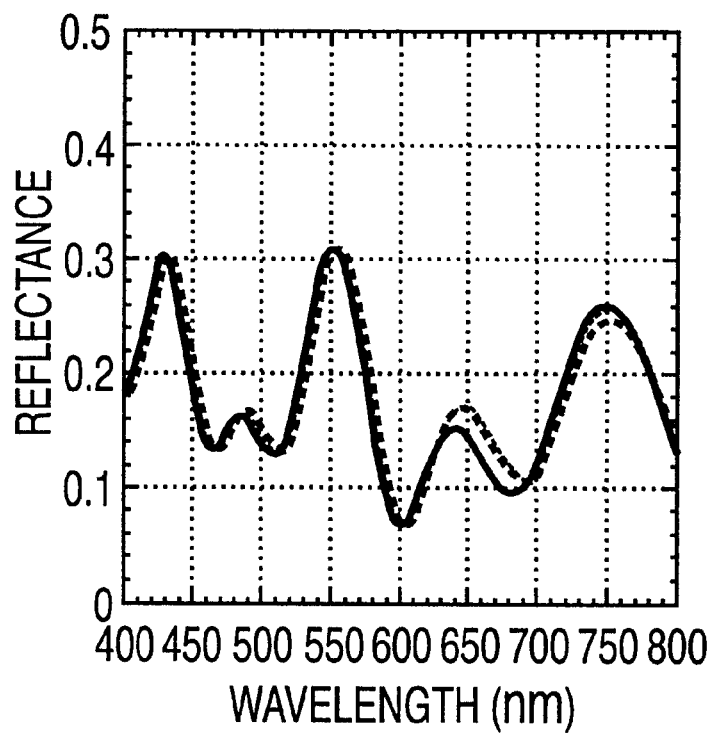
FIG. 11(a) includes plots, with respect to Example 6, of reflectance versus wavelength obtained from regions A, B, and C, respectively, of FIG. 10 which have fine features.
Figure 11B:
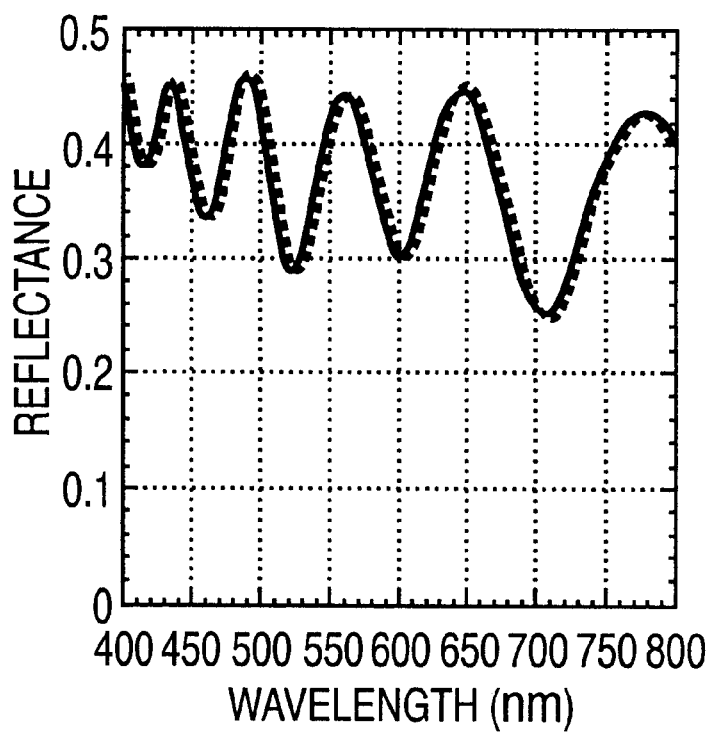
FIG. 11(b) includes plots, with respect to Example 6, of reflectance versus wavelength obtained from regions D, E, and F, respectively, of FIG. 10 which have coarser features than regions A, B, and C.

The plots shown in FIG. 11(*a*) are of the spectral waveform signals obtained from the regions A, B, and C, and indicate the degree of fineness in these regions. FIG. 11(*b*) shows the spectral waveform signals obtained from the regions D, E, and F, and indicate the lesser degree of fineness in these portions. Based on the similarities of the waveforms shown in FIG. 11(*a*), the regions A, B, and C are classified in a "block 1" category. Similarly, the regions D, E, and F are classified in another category referred to as "block 2."

The sample wafer was polished to several prescribed thickness values ranging from zero to the maximum prescribed thickness. The spectral waveform was measured after polishing reduced the insulating layer to each of the prescribed thickness values. The difference between the largest local maximum and the smallest local minimum was obtained for each of the blocks 1 and 2 at each of the various thickness values. Between blocks 1 and 2, a significant difference was observed between the largest local maximum and the smallest local minimum at the various thickness values. However, within the same block, no significant difference was observed between the largest local maximum and the smallest local minimum at the various thickness values. This result allowed appropriate constants to be set between the values for block 1 and the values for block 2. These values were stored as reference information.

In other words, all possible values of the maxima and all possible values of the minima of each spectral reflectance were pre-stored for each block. Identification of a block from which the signal light propagates can be identified by comparing the measured maximum values with the pre-stored values of maxima for each block.

In addition to these values, data useful for determining film thickness and for establishing the polishing endpoint were also determined from the differences between the largest local maximum and the smallest local minimum, and stored for future reference.

An image-pickup device having the same shape as the sample wafer used to obtain the reference data was selected for use as a product wafer. A $SiO_2$ insulating film was formed on the top surface of the product wafer to about 1000 nm thick by CVD. Polishing of the product wafer was then initiated. The difference between the largest local maximum and smallest local minimum of the spectral waveform was measured during polishing of the product wafer. The difference values obtained with the product wafer were compared to the values stored as reference data. Whenever a difference value was larger than the corresponding constant obtained with the reference wafer, the respective spectral waveform was produced by block 1. Otherwise, the respective spectral waveform was produced by block 2.

The difference between the largest local maximum and the smallest local minimum was used as the measurement parameter for detecting the polishing endpoint. Only regions corresponding to block 1 were monitored, leaving block 2 unmonitored. During polishing, the difference between the largest local maximum and the smallest local minimum changed. This difference was compared with the film thickness or polishing endpoint data of the reference wafer to determine the polishing endpoint for the sample wafer. When the process endpoint was detected, polishing was terminated.

Certain product wafers that had completed the polishing step were examined. Planarization of each product wafer was confirmed. It was also confirmed that each of the examined product wafers had been polished to within about 3 percent of the target thickness of 500 nm.

EXAMPLE 7

This example differs from Example 6 in that a cross-correlation was calculated of the measured spectral waveform values with the recalled reference spectral waveform values associated with the polishing endpoint. The cross-correlations were used as the measurement parameter in place of the differences between the largest local maximum and the smallest local minimum. Otherwise, the measurements were conducted using the same apparatus and methods as described in Example 6.

In view of the differences from Example 6, the spectral waveforms of the polishing endpoint obtained from the regions of block 1 as film-thickness information or polishing-endpoint information were stored as reference information.

The cross-correlations were determined as polishing progressed. The results were compared with the constant values stored as reference data. Whenever the results of the cross-correlations were larger than the corresponding constant values, it was determined that the respective spectral waveform came from the regions of block 1. Otherwise, the spectral waveforms were deemed to have come from the regions of block 2.

As in Example 6, only the regions of block 1 were monitored. During the polishing process, only the cross-correlation of the measured spectral waveforms and the reference spectral waveforms associated with the polishing endpoint (stored as reference data) was calculated. Polishing was terminated at the point on the plot at which the cross-correlation rapidly increased.

Some of the product wafers that had completed polishing were examined. From such examinations, it was confirmed that the surface of each of the observed wafers had been planarized. It was also confirmed that each of the observed wafers had been polished to within about 3 percent of the target thickness of 500 nm.

EXAMPLE 8

This example differs from Example 6 in that a local minimum was used as the measurement parameter for determining measurement position. Whenever the value of the measurement parameter was below a prescribed value, it was determined that the spectral waveform came from a block-1 region. Otherwise, the spectral waveform was deemed to have originated from a block-2 region. Except for these differences, measurements were conducted using the same apparatus and the same methods as in Example 6.

As polishing progressed, the local minimum changed. The local minimum was compared to the film-thickness or polishing-endpoint data (previously stored) to determine the actual polishing endpoint. Upon reaching the polishing endpoint, polishing was terminated.

Some of the product wafers that had finished being polished were examined. From the examinations, it was confirmed that the surface of each of the observed wafers had been planarized. Moreover, it was confirmed that each of the observed wafers had been polished to within about 3 percent of the target thickness of 500 nm.

EXAMPLE 9

This example utilized the same measurement methods, apparatus, and position-detection methods as in Example 6 (i.e., based on a difference between the largest local maximum and the smallest local minimum). On a wafer, a metal (aluminum) layer was polished using CMP while the formation of plugs was monitored. At the start of polishing, the entire surface to be polished was covered with the metal layer. Probe light reflected by the metal layer at this stage exhibited a substantially flat spectral waveform. As polishing progressed and the underlying insulating layer began to be exposed, local maxima and local minima started to appear in the spectral waveform due to interference. The difference between the largest local maximum and the smallest local minimum was compared with a constant value previously measured using a test wafer and stored as reference data. If the value of the measurement parameter dropped below the prescribed constant value, then the spectral waveform was deemed to have been produced by a block-1 region. Otherwise, the spectral waveform was deemed to have come from a block-2 region.

Seventh Embodiment

When a probe light is illuminated onto a wafer including a device pattern that is two-dimensionally non-uniform, the waveform of the resulting signal light reflected from the wafer differs significantly from a waveform of signal light that would be otherwise be obtained by reflection of probe light from a non-patterned blank film. The signal light is also affected by interference between pattern features.

Figure 12:
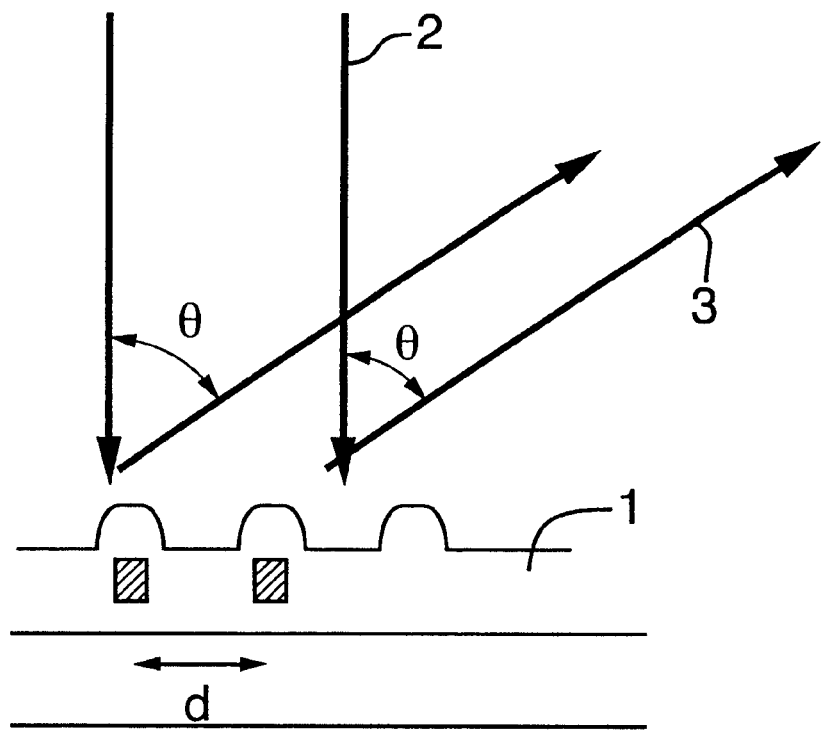
FIG. 12 depicts, with respect to the Seventh Embodiment, the production of diffraction spots in signal light reflected from a wafer surface. The pattern on the wafer has a feature pitch "d", wherein the nth diffraction spot is a function of the pitch of the pattern and the wavelength $\lambda$ of the probe light in the direction of the reflection direction $\theta$.

In addition to ordinary reflected signal light from a wafer, many diffraction spots are produced, and the amount of light from such spots cannot be ignored. As shown in FIG. 12, the nth diffraction spot is a function of the pitch "d" of the pattern on the wafer and the wavelength $\lambda$ of the probe light in the direction of the reflection direction $\theta$. The nth diffraction spot is thus determined by the following equation:

$$D \sin\theta = n\lambda \quad (3)$$

The amount of signal light at the nth diffraction spot changes in accordance with the thickness of the layer on the wafer in a manner that is different from the amount of change exhibited at a diffraction spot of any other order. Therefore, in order to determine the film thickness from the signal light, the diffraction order of the spot being measured must be known.

According to conventional practice, the thickness of a patterned layer is determined by measuring diffraction spots only of prescribed orders (i.e., higher than first order). However, the conventional method cannot accommodate various patterns. As indicated by Equation (3), above, the direction $\theta$ of the diffracted signal light (i.e., the position of the spot) depends on the period "d" of the features in the pattern. Providing a mechanism that can be used with any of various directions of diffracted light is extremely complicated.

In this embodiment, only the zeroth order of diffracted light (i.e., regularly reflected light) is detected. Thus, there is no need to take the influence of the pattern pitch into consideration when calculating the film thickness or detecting the process endpoint. This also substantially simplifies the calculations. Moreover, in measuring a device pattern, the influence of signal light scattered from bumps on the surface of the wafer can be a significant component of signal light besides the regularly reflected light. This component manifests itself as noise. By deliberately extracting and measuring only the zeroth-order light, a large portion of the noise caused by scattered signal light is eliminated. The direction of propagation of the regularly reflected signal light (zeroth-order light) is constant regardless of the pattern. This makes it comparatively easy to configure a detection system for such light.

In order to measure only the zeroth-order signal light, it is necessary to eliminate, in an efficient manner, diffracted lights of order higher than zeroth order. The present embodiment achieves such a goal. Specifically, in this embodiment, probe light is illuminated vertically onto a measurement sample. The thickness of a layer on the measurement sample is detected from the zeroth-order signal light reflected from the measurement sample.

Figure 13:
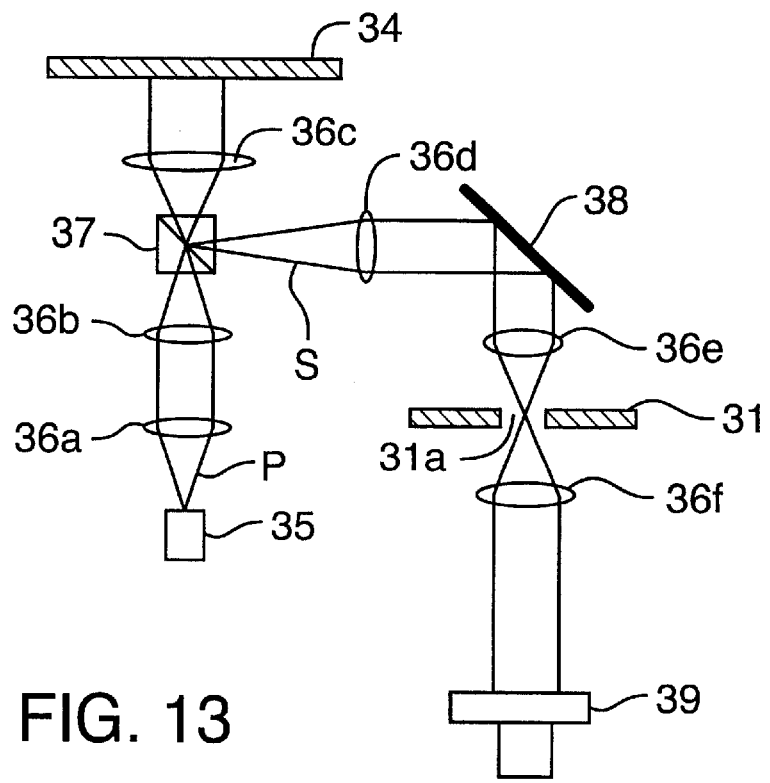
FIG. 13 depicts an apparatus according to the Seventh Embodiment.

An apparatus according to this embodiment is shown in FIG. 13. The apparatus comprises a source 35 of probe light P, lenses 36a–36f, a beamsplitter 37, a mirror 38, a light-blocking plate 31 (defining an aperture 31a), and a detector 39. Item 34 is a workpiece (e.g., wafer). The plate 31 defines a slit-shaped orifice 31a. The plate 31 blocks diffracted signal light S but allows regularly reflected (zeroth order) signal light to pass through the orifice to the detector 39.

As described above, the directions of propagation of higher orders of diffracted light (orders greater than 0) are a function of the period of the features of the pattern on the wafer 34. Therefore, when unwanted diffracted light is blocked as described above, the allowable size range of the slit orifice 31a differs depending on the pattern. Therefore, it is desirable that the width of the slit 31a be variable according to the pattern to be measured.

Another effective method is to measure only the zeroth-order light by detecting only signals emitted from pixels of an image-pickup device that receive zeroth-order light. I.e., signal light is received by a two-dimensional image-pickup device (CCD or the like) sufficiently large to receive not only zeroth-order signal light but also higher orders of diffracted light. However, the zeroth-order light is selectively detected by the image-pickup device.

At least one measurement parameter of the zeroth-order light is measured. The measurement parameter is selected from the following that can be plotted against wavelength of signal light:

(a) local maximum of a spectral characteristic of signal light, (b) local minimum of a spectral characteristic of signal light, (c) (local maximum of a spectral characteristic)–(local minimum of the spectral characteristic), (d) (local minimum of a spectral characteristic)/(local maximum of the spectral characteristic), (e) largest local maximum of a spectral characteristic of signal light, (f) smallest local minimum of a spectral characteristic of signal light, (g) (largest local maximum of a spectral characteristic)–(smallest local minimum of the spectral characteristic), (h) (smallest local minimum of a spectral characteristic)/(largest local maximum of the spectral characteristic), (i) dispersion of a spectral characteristic of signal light, and (j) an appropriate component of a Fourier transform of a spectral characteristic of signal light (e.g., a component whose magnitude is maximum).

A representative spectral characteristic is spectral reflectance. By monitoring the selected parameter(s), and by comparing the spectral characteristic signal with a previously stored spectral characteristic signal (obtained, e.g., by a simulation calculation), the thickness of the remaining layer being polished or the process endpoint can be detected with high accuracy. The zeroth-order light of the signal light can alternatively be directly monitored without dispersing the light and without monitoring one or more of the above-listed parameters.

The methods of this embodiment are not only effective when the thickness of the remaining layer being polished is measured using a probe light comprising multiple wavelength components, but also when the probe light contains a single wavelength component.

Methods according to this embodiment can be performed using an apparatus as shown in FIG. 2 and discussed above.

EXAMPLE 10

In this example, a $SiO_2$ inter-layer insulating film on an image pickup device being fabricated on a 6-inch diameter wafer was polished by CMP using the polishing apparatus of FIG. 2. To allow monitoring of the film thickness during polishing, the window 15 (made of quartz) had a diameter of 2 cm and extended through the polishing plate 14 and polishing pad 13. The polishing pad 13 was made of an epoxy resin and contacted the bottom surface of the wafer 12. The probe light P was illuminated through the window 15 and reflected signal light S returned through the window 15.

The measurement-optical system was configured as shown in FIG. 3. The source 19 of probe light was a xenon lamp that produced white light. The probe light P was incident perpendicularly on the surface of the wafer 12. Signal light S passed through a pinhole 25a defined by the plate 25. The plate 25 blocked scattered and diffracted light. Signal light passing through the pinhole 25a propagated to a diffraction grating G. The diffraction grating G resolved the wavelength of the signal light S so that different wavelengths propagated in different directions toward the linear sensor 24. A slit 20a defined by a plate 20 determined the area on the wafer surface illuminated by the probe light P. The wavelength measurement range of the linear sensor 24 was approximately 400 nm to 800 nm. The diameter of the illumination spot of probe light P on the wafer 12 was about 2 mm. The output from the linear sensor 24 was amplified and processed by the processor 17 (e.g., PC). A previously measured spectral intensity profile of the probe light P was used in determinations of a spectral characteristic of the signal light S.

The polishing slurry 105 used in this example was an alkaline suspension of silica particles. The polishing pressure was about 100 $g/cm_2$. Light scattering due to the polishing slurry was less than 1%.

The aperture 25a defined by the plate 25 had a diameter of 500 µm, which was effective for eliminating most of the scattered light and diffracted light of first-order or above.

Figure 14A:
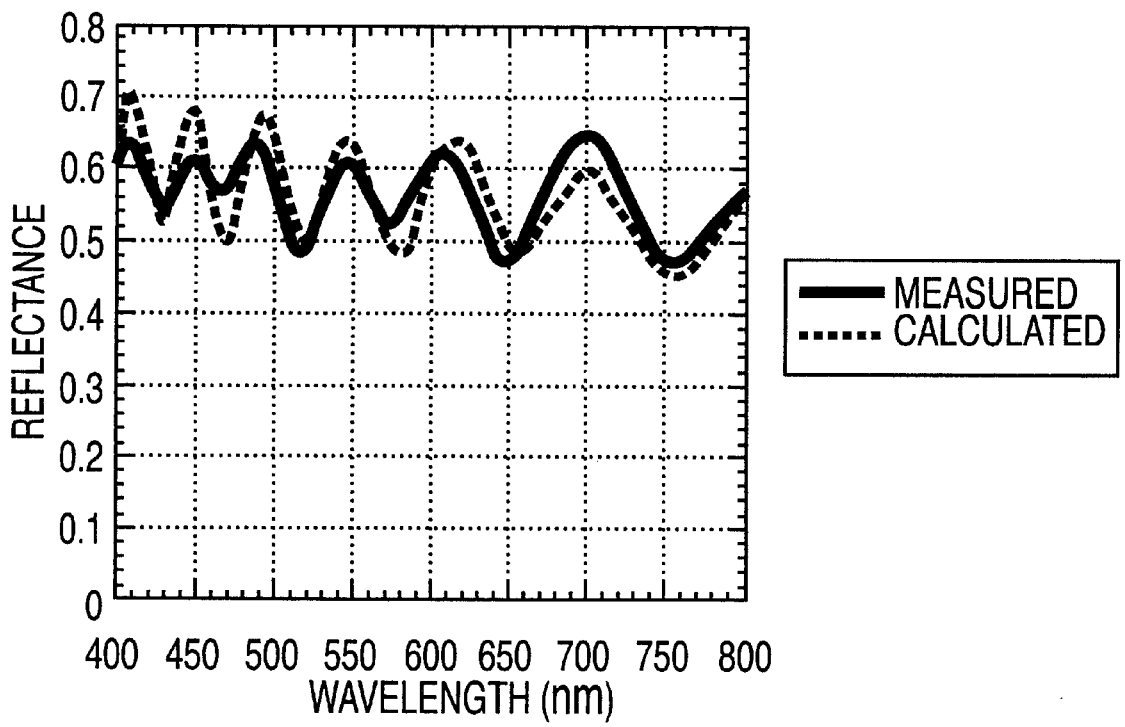
FIG. 14(a) includes plots, with respect to Example 10, of measured and calculated values of spectral reflectance of a wafer (zeroth-order diffracted signal light only) at start of polishing.
Figure 14B:
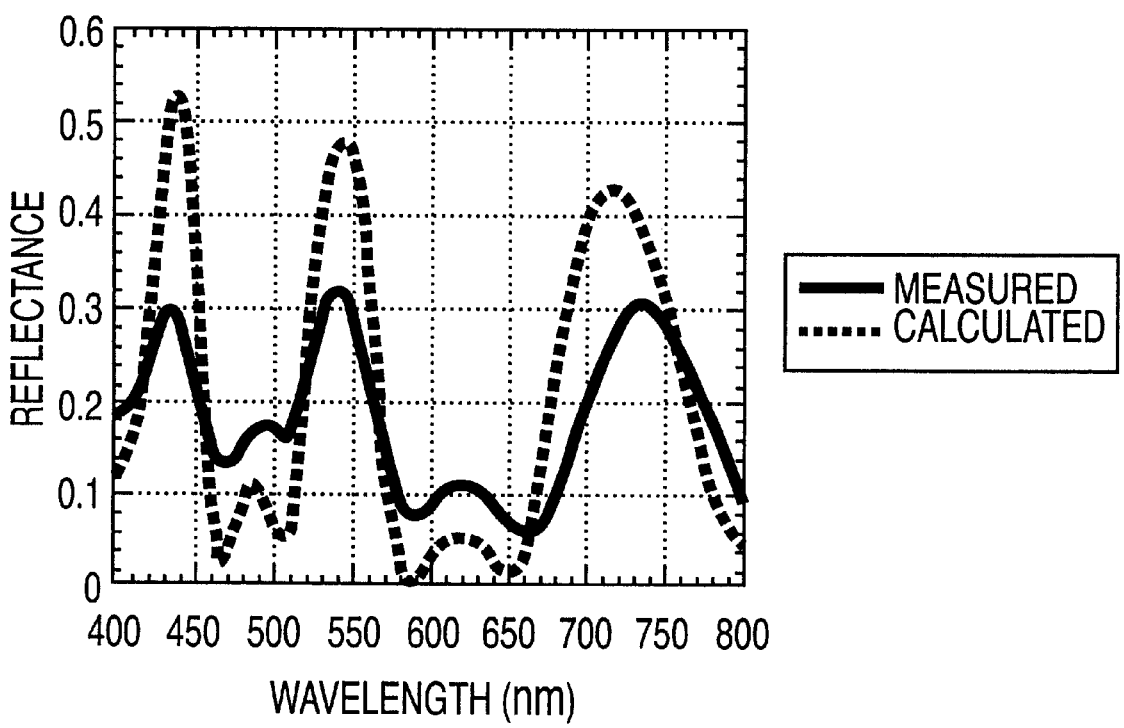
FIG. 14(b) includes plots, with respect to Example 10, of measured and calculated values of spectral reflectance of a wafer (zeroth-order diffracted signal light only) at the polishing endpoint.

Results obtained from measurements of the spectral characteristic of the wafer being polished are shown in FIGS. 14(a) and 14(b). The spectral characteristic in this instance was spectral reflectance. In each of FIGS. 14(a) and 14(b), the curve for "measured" data (solid line) fits very well with the curve for "calculated" data (broken line) for reflectance of zeroth-order diffracted light as a function of light wavelength. FIG. 14(a) shows data at start of polishing, and FIG. 14(b) shows data at the polishing endpoint. These results indicate that measuring only the zeroth-order light provided accurate agreement with model data.

The "calculated" spectral reflectance data were obtained using a wafer having a prescribed polished film thickness. The "calculated" data were compared to spectral reflectance data obtained during polishing of a test wafer. At the moment the waveform of the spectral reflectance obtained by measurement agreed, within a certain range, with the waveform of the spectral reflectance obtained by calculation, it was determined that polishing of the subject thin film was completed. In examinations of wafers that had "completed" polishing, it was confirmed that the respective surfaces of the wavers had been planarized to within 7 percent of the target film thickness.

EXAMPLE 11

This example utilized the same optical system as used in Example 10, except that a helium-neon laser was used as the source of probe light (wavelength 633 nm). In this example, a spectral curve was not used. The polishing endpoint was determined by monitoring the intensity profile of probe light reflected from the wafer surface. This method was effective whenever the pattern on the wafer was simple. Also, by utilizing a slit in the same manner as in Example 10, it was possible to block all first-order and higher orders of diffracted light. Since the diffraction spots could been seen with the unaided eye, it was visually confirmed that the diffraction spots were blocked by the slit. By tracking only the intensity of the zeroth-order light by this method, the polishing endpoint was accurately detected.

Eighth Embodiment

Figure 15:
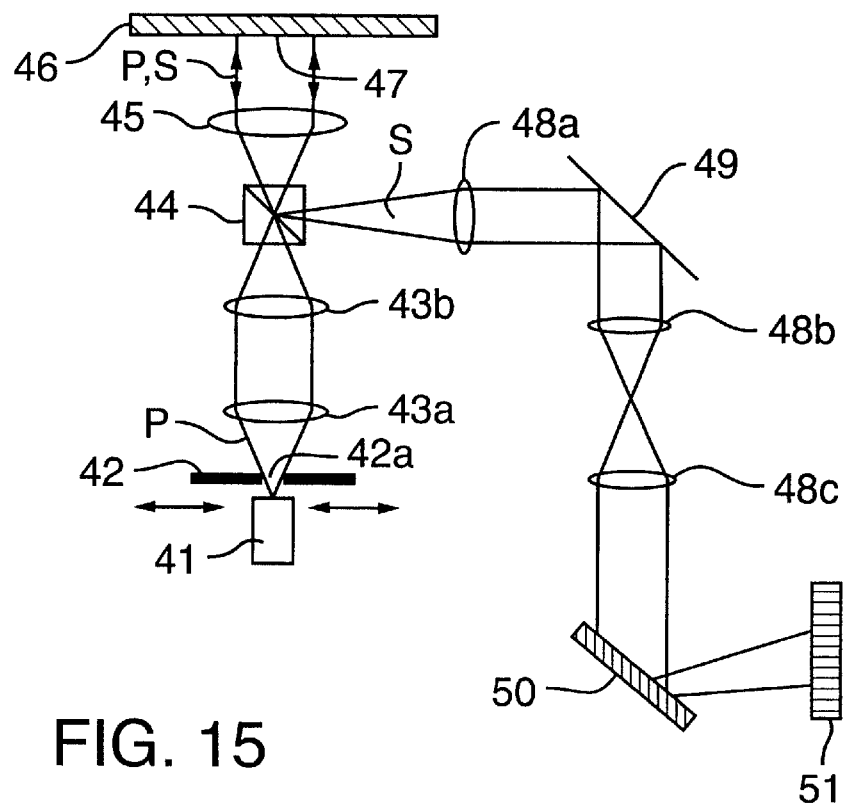
FIG. 15 depicts a measurement optical system according to the Eighth Embodiment.

A measurement optical system according to this embodiment is shown in FIG. 15. The system comprises a source 41 of probe light P (desirably a source of white light), a spatial coherence controller 42, lenses 43a, 43b, a beamsplitter 44, and a collimating lens 45 that directs probe light P to a surface 47 of a wafer 46. The spatial coherence controller 42 operates to control the spatial coherence length; to such end, the spatial coherence controller 42 can be, for example, an aperture. The apparatus also comprises lenses 48a, 48b, 48c for refracting reflected signal light S, a mirror 49, a diffraction grating 50, and a light sensor 51. The source 41 can be, for example, a tungsten lamp, a metal halide lamp, a xenon lamp, or the like. The spatial coherence controller 42 can comprise, e.g., a plate defining a slit aperture 42a. The plate desirably includes a mechanism (such as a screw mechanism, not shown) for adjusting the width of the slit 42a. Another slit (not shown in FIG. 15, but see FIG. 13) is preferably situated in the path of the signal light S for blocking all orders of diffracted signal light except for zeroth-order light, thereby allowing only zeroth-order light to pass to the sensor 51. The diffraction grating 50 can be any of various gratings, prisms, and the like useful for splitting different wavelengths of light (a grating is preferred). The sensor 51 is desirably a linear sensor comprising multiple light-receiving units that are one-dimensionally separated from each other (e.g. an optical diode type line sensor such as a "512 device"). The different wavelengths of signal light S dispersed by the grating 50 are received simultaneously by the sensor 51.

The surface 47 of the wafer 46 can be, e.g., an insulating layer formed on a semiconductor device pattern on the wafer 46. The source 41 of probe light P is adjusted to a suitable spatial coherence length by adjusting the slit width in the spatial coherence controller 42. (The spatial coherence length is a distance, on the device pattern, in which the irradiated probe light has coherency.) The spatial coherence length can be varied by adjusting the beam diameter of the probe light. The probe light P passes through the lenses 43a, 43b and the beamsplitter 44, is collimated by the collimator lens 45, and is illuminated onto the surface 47 of the wafer 46. Signal light S reflected from the surface 47 carries information regarding the surface 47. The signal light S passes through the lenses 48a, 48b, 48c. Zeroth-order signal light S propagates to the grating 50 that disperses the zeroth-order light according to wavelength. The wavelength-dispersed signal light is detected by the sensor 51.

Figure 16:
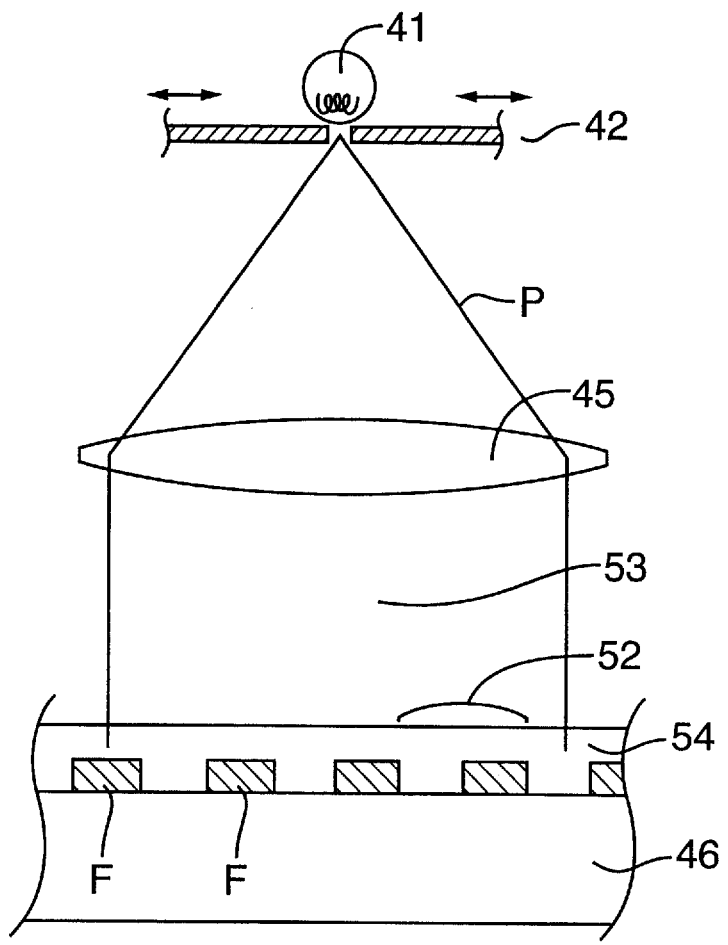
FIG. 16 is a schematic depiction of the manner in which the probe light illuminates multiple features of a pattern on the wafer surface in the Eighth Embodiment.
Figure 17:
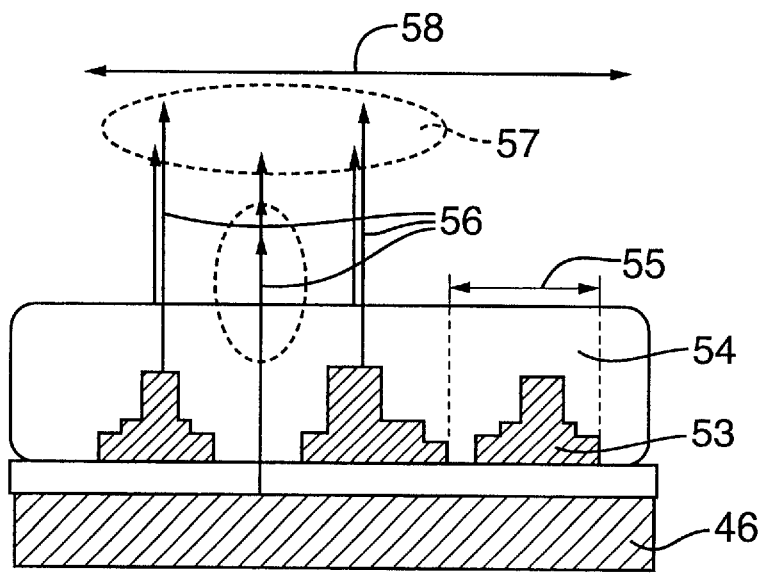
FIG. 17 shows a magnified vertical section of a portion of the pattern structure on the wafer surface, illustrating the principle by which the reflected signal light from individual features is superposed in the Eighth Embodiment.

The relationship between the semiconductor device pattern on the wafer 46 and the coherence length is as follows. From an optical perspective, the semiconductor device pattern typically comprises a large number of extremely fine features that are two-dimensionally distributed in each of one or more laminated thin films on the wafer surface. Each thin film typically has a different pattern. The probe light P simultaneously illuminates multiple features of the pattern on the wafer surface 47 as shown schematically in FIG. 16. In FIG. 16, by way of example, the probe light P from the source 41 illuminates four features F of the pattern. The components of reflected signal light from the features F are superposed in a complex manner in the signal light S. For example, FIG. 17 shows a magnified vertical section of a portion of the pattern structure on the wafer surface 46, illustrating the principle by which the reflected signal light from individual features is superposed. In order to measure the thickness of a portion of the surface having a pattern structure, probe light P (desirably having a spot diameter larger than the size of individual features of the pattern) is illuminated onto the wafer surface 46. The influence of the signal light reflected from each feature illuminated within the spot is taken into consideration. For example, whether light 56 reflected from features having the same height mutually interfere or not interfere is considered.

In FIG. 17, signal light produced by reflection from multiple features is simplified to provide a model for discussion. Item 46 is the wafer. Items 53 are individual features of the pattern (e.g., electrode features). The features 53 are covered with an insulating layer 54. In FIG. 17, components 56 of signal light are shown reflecting from the features 53 and from the surface of the insulating film 54. Each component 56 of the signal light is an amplitude component of interference light. The number of amplitude components is indicated by the number of upwardly directed arrows in the figure. The reference number 55 refers to the pitch of the pattern.

FIG. 17 shows three components of reflected signal light 56 (each component being reflected from a different surface). The reference number 58 refers to the spatial coherence length of the reflected signal light. The reference number 57 refers to a region above the pattern within which the components of reflected signal light interfere with one another.

Whether an interference occurs in the region 57 is important from a practical and theoretical perspective. The occurrence of interference depends upon the fineness of the pattern and the spatial coherence length of the spot of incident probe light. If the pitch of the pattern inside the spot is shorter than the spatial coherence length, then an interference is generated. Otherwise, no interference is generated.

In general, the spatial coherence length of an optical system is infinite at an ideal point source of light. In all other optical systems, the spatial coherence length is finite. In this embodiment, the spatial coherence length is desirably made variable by changing the optical system (i.e., changing the arrangement of one or more optical members and the like). Thus, theoretically, the spatial coherence length can be varied if desired according to the fineness of the pattern.

In this embodiment, the spatial coherence length can be controllably varied by changing the perspective angle of the source of probe light. According to Zernike's theorem, a relationship exists among the spatial coherence length, the wavelength $\lambda$, and the numerical aperture NA, as follows:

spatial coherence length ≈ $0.61\lambda/NA$

Hence, changing the numerical aperture NA of the optical system can result in a change in the spatial coherence length. More specifically, by changing the slit width of the probe-light optical system immediately downstream of the light source in a manner as described above, the spatial coherence length can be controlled in a desired manner.

Returning to FIG. 15, in performing measurements of a wafer surface containing a device pattern, it is desirable that the spatial coherence length be larger than the pitch of the pattern. For most patterns currently imprinted onto wafers, the pitch is usually less than 1 $\mu$m. It is relatively easy to set the spatial coherence length of the probe-light source sufficiently larger than 1 $\mu$m. The intensity profile of signal light measured under such a condition agrees well with a signal-light intensity profile theoretically calculated under an assumed condition in which interference occurs in the signal light simultaneously reflected from multiple features on the surface of the film. However, if the pattern is coarser than usual and has a feature size of, e.g., about 10 $\mu$m, then it is more difficult to set the spatial coherence length sufficiently larger than the pitch. When measuring the film thickness of such a coarse pattern, the signal-light intensity is theoretically calculated on the assumption that that interference does not occur. Hence, in conducting measurements according to this embodiment, the coherence length of the probe-light source is desirably smaller than the pitch of the pattern on the wafer surface. Under such conditions, the actually measured intensity profile of signal light agrees well with a theoretically calculated intensity profile of reflected signal light in which interference occurs.

The intensity of reflected signal light can be calculated by executing an optical calculation (i.e., a calculation of theoretical spectral reflectance) of the superposition of light waves. The optical calculation is executed when interference does occur in the film-surface direction (i.e., lateral direction parallel to the film surface) and when interference does not occur in the film-surface direction with respect to, e.g., signal light reflected from multiple features having the same height. According to conventional practice, it is generally not easy to directly calculate the thickness of the film to be measured. Hence, according to this embodiment, the theoretical intensity profile of signal light reflected from a patterned surface having a prescribed film thickness, feature size, and feature density is calculated. The calculated theoretical intensity profile is then compared with an actually measured intensity profile of reflected signal light to calculate the film thickness.

More specifically, the theoretical intensity profile of reflected light from each of multiple films is calculated. The films are pre-selected based on an inter-layer distance that is determined by the measurement precision. The calculations are made on the assumption that interference occurs in the signal light reflected from multiple features simultaneously illuminated by the probe light or on the assumption that interference does not occur. The calculated intensity profile corresponds to the fineness of the pattern (pitch of the pattern). The intensity profile of reflected signal light can be calculated for each type of pattern, and data obtained from such calculations can be stored in a memory for later recall.

It is difficult theoretically to calculate the intensity profile of signal light under a condition of partial interference (a condition that is intermediate a state in which an interference is occurring in the signal light and a state in which an interference is not occurring). One reason for such difficulty is that, with an optical system adjusted to have a coherence length sufficient to cause partial interference, the degree of partial interference changes in response to even slight changes in the fineness of the pattern. (The degree of partial interference is equivalent to a ratio of a portion of the pattern where interference occurs to a portion where interference is not occurring.) As a result, the theoretical calculations would require that the intensity profile of signal light be separately calculated under each of multiple different partial interference conditions for each pattern having a slightly different fineness. Such calculations are difficult to perform and utilize from a practical standpoint.

Therefore, according to this embodiment, it is very effective to vary the spatial coherence length of the probe light in accordance with the fineness of a pattern so as to better distinguish a state of interference from a state of non-interference in the signal light.

The measuring method described above can be applied to a polishing apparatus comprising a device for detecting film thickness and for detecting a process endpoint, such as the apparatus shown in FIG. 2. Details of construction and operation of the FIG.-2 apparatus have already been discussed and such discussion is not repeated here.

Further with respect to the FIG.-2 apparatus, the signal processor 17 stores and recalls data on various intensity profiles of signal light, and compares a measured signal-light intensity profile with corresponding recalled data. The signal processor 17 also calculates a cross-correlation coefficient between the measured signal-light intensity profile and each of the recalled signal-light intensity profiles associated with the recalled patterns and the thickness of the recalled patterns. The signal processor 17 then selects the recalled pattern having the largest cross-correlation coefficient, and regards the selected pattern and the thickness thereof as corresponding to the actual measured pattern and the thickness thereof, respectively.

In performing a comparison of the measured pattern with a stored pattern based solely on cross-correlation coefficients, a determination of the film thickness of a measured pattern can be difficult depending on the type of the measured pattern. Hence, in addition to comparing cross-correlation coefficients associated with the signal-light intensity profiles, it is desirable to calculate cross-correlation coefficients of Fourier-transformed theoretically calculated intensity profiles (of stored data) with a Fourier-transformed intensity profile of an actual measured intensity profile so as to obtain multiple cross-correlation coefficients. It is also desirable to compare the multiple cross-correlation coefficients with each other or to compare a Fourier component of the measured signal-light intensity profile with one or more Fourier components of the stored signal-light intensity profile. It is even more desirable to use both of these comparison procedures.

In general, a device field on a wafer includes multiple patterns having various degrees of fineness and exhibiting various intensity profiles of signal light. In measuring film thickness, it is important to ascertain which of the multiple patterns is actually being illuminated with the probe light. As discussed above, all possible spectral reflectance profiles corresponding to the various blocks are pre-stored. The particular pattern being irradiated with probe light can be identified by comparing the measured spectral reflectance with corresponding spectral reflectance profiles that were pre-calculated and stored. In any event, the measurements are repeated as required as polishing is ongoing. Polishing is terminated when the target film thickness is achieved.

The thickness of the layer being polished can be measured in situ as polishing is ongoing, or can be measured off-line by removing the wafer from the polishing apparatus.

Whereas the invention has been described in connection with multiple embodiments and examples, it will be understood that the invention is not limited to those embodiments and examples. On the contrary, the invention is intended to encompass all modifications, alternatives, and equivalents as may be included within the spirit and scope of the invention as defined by the appended claims.

What is claimed is:

1. An apparatus for determining a process endpoint of a process for reducing a thickness of a thin-film layer on a substrate, the apparatus comprising:
   (a) a source of a probe light;
   (b) a probe-light optical system configured and situated so as to direct the probe light to a location on a surface of the thin-film layer so as to produce a signal light propagating from the location;
   (c) a detector operable to detect the signal light;
   (d) a signal-light optical system configured and situated so as to direct the signal light from the location to the detector; and
   (e) a signal processor connected to the detector, the signal processor being configured to measure a spectral characteristic of the signal light from the detected signal light, calculate a parameter of the spectral characteristic that is a function of the thickness of the thin-film layer; and determine the thickness of the thin-film layer from the calculated parameter.

2. An apparatus for determining a process endpoint of a process for reducing a thickness of a thin-film layer on a substrate, the apparatus comprising:
   (a) a source of a probe light;
   (b) a probe-light optical system configured and situated so as to direct the probe light to a location on a surface of the thin-film layer so as to produce a signal light propagating from the location;

(c) a detector operable to detect the signal light;

(d) a signal-light optical system configured and situated so as to direct the signal light from the location to the detector;

(e) a plate situated in the signal-light optical system defining an aperture, the aperture being configured so as to remove all orders of diffracted light from the signal light except zero-order reflected light; and (f) a signal processor connected to the detector, the signal processor being configured to measure a spectral characteristic of the signal light from the detected signal light, calculate a parameter of the spectral characteristic that is a function of the thickness of the thin-film layer; and determine the thickness of the thin-film layer from the calculated parameter.

3. The apparatus of claim 2, wherein the aperture is variable.

4. An apparatus for planarizing a surface of a workpiece, comprising:

(a) a polishing pad;

(b) a polishing head configured to support the workpiece and contact the workpiece against the polishing pad;

(c) a mechanism configured to move the polishing pad and the polishing head relative to each other as the workpiece contacts the polishing pad for polishing the workpiece; and (d) a device for determining a polishing-process endpoint, comprising a source of a probe light; a probe-light optical system configured and situated so as to direct the probe light to a location on a surface of the thin-film layer so as to produce a signal light propagating from the location; a detector operable to detect the signal light; a signal-light optical system configured and situated so as to direct the signal light from the location to the detector; a plate situated in the signal-light optical system defining an aperture, the aperture being configured so as to remove all orders of diffracted light from the signal light except zero-order reflected light; and a signal processor connected to the detector, the signal processor being configured to measure a spectral characteristic of the signal light from the detected signal light, calculate a parameter of the spectral characteristic that is a function of the thickness of the thin-film layer; and determine the thickness of the thin-film layer from the calculated parameter.

5. In an apparatus for planarizing a surface on a semiconductor wafer imprinted with a semiconductor device, an apparatus for measuring a thickness of a layer on a surface of the semiconductor device imprinted on the wafer so as to provide a planarizing process endpoint, the apparatus comprising:

(a) an illumination system configured to illuminate a probe light onto a portion of the surface of the layer on the wafer so as to produce a signal light propagating from the surface;

(b) a measuring system configured and situated to measure a change in an intensity of the signal light;

(c) a numerical calculation system connected to the measuring system and configured to calculate a theoretical intensity profile of signal light based on an optical model, the optical model being based on a comparison of a spatial coherence length of the probe light with a degree of fineness of a pattern for the semiconductor device illuminated with the probe light; and (d) a detection system configured and situated to detect at least one of a layer thickness and the process endpoint by comparing the measured intensity profile of signal light with the calculated theoretical intensity profile of signal light.

6. The apparatus of claim 5, further comprising a controller connected to the numerical calculation system, the controller being configured to control a spatial coherence length of the probe light.

7. The apparatus of claim 6, further comprising a storage system connected to the controller, the storage system being operable to store data concerning the calculated theoretical intensity profile of signal light.

8. The apparatus of claim 5, wherein the detection system:

performs the comparison using a cross-correlation coefficient of the calculated theoretical intensity profile of the signal light and a measured intensity profile of the signal light, and performs a similarity comparison using at least one of a cross-correlation coefficient of a Fourier transform of the calculated theoretical intensity profile of the signal light and the measured intensity profile of the signal light, and a position and magnitude of a Fourier component of the calculated theoretical intensity profile of the signal light and a position and magnitude of a Fourier component of the measured intensity profile of the signal light.

9. An apparatus for planarizing a surface of a workpiece, comprising:

(a) a polishing pad;

(b) a polishing head configured to support the workpiece and contact the workpiece against the polishing pad;

(c) a mechanism configured to move the polishing pad and the polishing head relative to each other as the workpiece contacts the polishing pad for polishing the workpiece; and (d) an apparatus for determining a process endpoint as recited in claim 1.

* * * * *

UNITED STATES PATENT AND TRADEMARK OFFICE
CERTIFICATE OF CORRECTION

PATENT NO.   : 6,670,200 B2
DATED        : December 30, 2003
INVENTOR(S)  : Ushio et al.

It is certified that error appears in the above-identified patent and that said Letters Patent is hereby corrected as shown below:

Column 4,
Line 5, "superficial" should read -- surficial --.

Column 23,
Line 58, "would be otherwise be" should read -- would otherwise be --.

Column 24,
Line 1, "Dsinθnλ" should read -- dsinθ=nλ --.

Column 26,
Line 36, "wavers" should read -- wafers --.
Line 49, "could been seen" should read -- could be seen --.

Signed and Sealed this

Eighth Day of February, 2005

JON W. DUDAS
*Director of the United States Patent and Trademark Office*